United States Patent
Jeon

(10) Patent No.: US 9,575,833 B2
(45) Date of Patent: Feb. 21, 2017

(54) CONTROLLER, SEMICONDUCTOR MEMORY SYSTEM AND OPERATING METHOD THEREOF

(71) Applicant: SK hynix Inc., Gyeonggi-do (KR)

(72) Inventor: Myeong-Woon Jeon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 4 days.

(21) Appl. No.: 14/839,236

(22) Filed: Aug. 28, 2015

(65) Prior Publication Data

US 2016/0266969 A1    Sep. 15, 2016

(30) Foreign Application Priority Data

Mar. 9, 2015    (KR) .................. 10-2015-0032598

(51) Int. Cl.

| | | |
|---|---|---|
| G06F 11/10 | (2006.01) | |
| H03M 13/00 | (2006.01) | |
| G11C 29/52 | (2006.01) | |
| H03M 13/45 | (2006.01) | |
| H03M 13/11 | (2006.01) | |
| H03M 13/37 | (2006.01) | |
| H03M 13/15 | (2006.01) | |
| H03M 13/23 | (2006.01) | |
| H03M 13/29 | (2006.01) | |

(52) U.S. Cl.
CPC .......... *G06F 11/1068* (2013.01); *G11C 29/52* (2013.01); *H03M 13/1111* (2013.01); *H03M 13/3723* (2013.01); *H03M 13/45* (2013.01); *H03M 13/6325* (2013.01); *H03M 13/152* (2013.01); *H03M 13/1515* (2013.01); *H03M 13/23* (2013.01); *H03M 13/2957* (2013.01)

(58) Field of Classification Search
CPC ...... G06F 11/1068; H03M 13/45; G11C 29/52
See application file for complete search history.

(56) References Cited

U.S. PATENT DOCUMENTS

| | | | |
|---|---|---|---|
| 8,429,501 B2 | 4/2013 | Tseng et al. | |
| 8,504,887 B1* | 8/2013 | Varnica ............. | H03M 13/1111 714/730 |
| 8,649,118 B1* | 2/2014 | Chang ................ | H03M 13/612 360/25 |
| 9,136,876 B1* | 9/2015 | Steiner ............. | H03M 13/2927 |
| 2003/0182617 A1* | 9/2003 | Kanaoka .......... | H03M 13/6331 714/794 |

(Continued)

FOREIGN PATENT DOCUMENTS

KR    1020080099191    11/2008

*Primary Examiner* — Joseph D Torres
(74) *Attorney, Agent, or Firm* — IP & T Group LLP

(57) ABSTRACT

An operating method of a memory controller includes performing a soft read operation to read data stored in a semiconductor memory device using a soft read voltage, performing a soft decision ECC decoding operation to the read data based on a first log likelihood ratio (LLR) value, and performing the soft decision ECC decoding operation to the read data based on a second LLR value when the soft decision ECC decoding operation based on the first LLR value fails. The first and second LLR values are selected between a default LLR value and an updated LLR value. The updated LLR value is generated on a basis of numbers of error bits and non-error bits of the read data, which are obtained through the soft decision ECC decoding operation to the read data.

20 Claims, 23 Drawing Sheets

(56) References Cited

U.S. PATENT DOCUMENTS

| | | | | |
|---|---|---|---|---|
| 2003/0229843 A1* | 12/2003 | Yu | ................... | H03M 13/1111 714/794 |
| 2006/0085726 A1* | 4/2006 | Rhee | ................... | H03M 13/15 714/784 |
| 2006/0123318 A1* | 6/2006 | Kim | ................... | H03M 13/1114 714/758 |
| 2006/0156171 A1* | 7/2006 | Kuznetsov | ......... | G11B 20/1866 714/755 |
| 2007/0089019 A1* | 4/2007 | Tang | ................ | H03M 13/1102 714/752 |
| 2011/0072331 A1* | 3/2011 | Sakaue | .............. | G06F 11/1012 714/763 |
| 2011/0223910 A1* | 9/2011 | Xin | ..................... | H04W 72/02 455/434 |
| 2012/0224420 A1* | 9/2012 | Sakurada | ................ | G11C 8/08 365/185.03 |
| 2012/0311402 A1* | 12/2012 | Tseng | .................. | G06F 11/1048 714/763 |
| 2013/0111292 A1* | 5/2013 | Obata | .................. | H03M 13/112 714/752 |
| 2013/0156139 A1* | 6/2013 | Lee | ...................... | H04L 1/0048 375/341 |
| 2014/0040704 A1* | 2/2014 | Wu | ...................... | G11C 29/52 714/773 |
| 2014/0129905 A1* | 5/2014 | Chen | .................. | H03M 13/1102 714/770 |
| 2014/0143637 A1* | 5/2014 | Cohen | ............... | H03M 13/1108 714/773 |
| 2015/0149871 A1* | 5/2015 | Chen | .................. | G06F 11/1068 714/773 |
| 2015/0200688 A1* | 7/2015 | Pan | ................... | H03M 13/3927 714/794 |
| 2015/0242268 A1* | 8/2015 | Wu | ..................... | G06F 11/1012 714/773 |

\* cited by examiner

- After 1 iteration
$\underline{v} = (\begin{matrix} 0 & 1 & 1 & 0 & 1 & 0 & 0 & 0 & 1 & 1 \end{matrix})$ $$H\underline{v}^t = \begin{pmatrix} 1 & 1 & 1 & 1 & 0 & 0 & 0 & 0 & 0 & 0 \\ 1 & 0 & 0 & 0 & 1 & 1 & 1 & 0 & 0 & 0 \\ 0 & 1 & 0 & 0 & 1 & 0 & 0 & 1 & 1 & 0 \\ 0 & 0 & 1 & 0 & 0 & 1 & 0 & 1 & 0 & 1 \\ 0 & 0 & 0 & 1 & 0 & 0 & 1 & 0 & 1 & 1 \end{pmatrix} \begin{pmatrix} 0 \\ 1 \\ 1 \\ 0 \\ 1 \\ 0 \\ 0 \\ 0 \\ 1 \\ 1 \end{pmatrix} = \begin{pmatrix} 0 \\ 1 \\ 0 \\ 0 \\ 0 \end{pmatrix} \neq \underline{0} \longrightarrow \text{Perform next iteration}$$

Syndrome check

| Read data | 0 | 1 | 1 | 0 | 0 | 1 | 0 | 1 |
|---|---|---|---|---|---|---|---|---|
| Corresponding LLR | 3 | -3 | -1 | 0 | 1 | -2 | 3 | -2 |
| Decoded date | 0 | 1 | 1 | 0 | 1 | 1 | 0 | 1 |
| Error/Non Error check @ Each LLR value | LLR : 3 Non-error | LLR : -3 Non-error | LLR : -1 Non-error | LLR : 1 Error | LLR : 0 Non-error | LLR : -2 Non-error | LLR : -3 Non-error | LLR : -2 Error |

| LLR value | # of Error bits | # of Non Error bits |
|---|---|---|
| 3 | 0 | 1 |
| 2 | 0 | 0 |
| 1 | 1 | 0 |
| 0 | 0 | 1 |
| -1 | 1 | 1 |
| -2 | 0 | 2 |
| -3 | 0 | 2 |

# CONTROLLER, SEMICONDUCTOR MEMORY SYSTEM AND OPERATING METHOD THEREOF

CROSS-REFERENCE TO RELATED APPLICATIONS

The present application claims priority of Korean Patent Application No. 10-2015-0032598, filed on Mar. 9, 2015, which is incorporated herein by reference in its entirety.

BACKGROUND

1. Field

Various exemplary embodiments of the present invention relate to a semiconductor design technology and, more particularly, to a controller, a semiconductor memory system and an operating method thereof.

2. Description of the Related Art

Semiconductor memory devices are generally classified into volatile memory devices, such as dynamic random access memory (DRAM) and static RAM (SRAM), and nonvolatile memory devices, such as read only memory (ROM), mask ROM (MROM), programmable ROM (PROM), erasable PROM (EPROM), electrically EPROM (EEPROM), ferromagnetic RAM (FRAM), phase change RAM (PRAM), magnetoresistive RAM (MRAM), resistive RAM (RRAM) and flash memory.

Volatile memory devices lose their data without a constant source of power, whereas nonvolatile memory devices are able to retain their data. In particular, flash memory devices are widely used as storage mediums in computer systems because of their high program speed, low power consumption and large data storage capacity.

In nonvolatile memory devices, especially in flash memory devices, data states of each memory cell are determined based on the number of bits of data stored in the memory cell. A memory cell storing 1-bit data is called a single-bit cell or a single-level cell (SLC). A memory cell storing multi-bit data (i.e., 2 or more bits of data) is called a multi-bit cell, a multi-level cell (MLC) or a multi-state cell. The multi-bit cell is advantageous for high integration. However, as the number of bits of data programmed in each memory cell increases, the reliability of the data decreases and the read failure rate of the data increases.

For example, when k-bit information is to be programmed in a memory cell, one of $2^k$ threshold voltages is formed in the memory cell. Due to minute differences between the electrical characteristics of memory cells, the threshold voltages of memory cells programmed with the same data form a threshold voltage distribution. Threshold voltage distributions correspond to $2^k$ data values corresponding to the k-bit information, respectively.

However, the voltage window available for each threshold voltage distribution is limited. Therefore, as the value k increases, the distance between the threshold voltage distributions decreases and the adjacent threshold voltage distributions overlap. As the adjacent threshold voltage distributions overlap, read data may include error bits.

FIG. 1 is a threshold voltage distribution diagram schematically illustrating program and erase states of a 3-bit multi-level cell (3-bit MLC) in a nonvolatile memory device.

FIG. 2 is a threshold voltage distribution diagram schematically illustrating program and erase states of a 3-bit MLC having deteriorated characteristics in a nonvolatile memory device.

In an MLC nonvolatile memory device, e.g., an MLC flash memory device in which k-bit data is programmed in a memory cell, the memory cell may have one of $2^k$ threshold voltage distributions. For example, a 3-bit MLC has one of 8 threshold voltage distributions.

Threshold voltages of memory cells programmed with the same data form the threshold voltage distribution due to characteristic differences between the memory cells. In a 3-bit MLC nonvolatile memory device, as illustrated in FIG. 1, threshold voltage distributions corresponding to 7 program states 'P1' to 'P7' and an erase state 'E' are formed. FIG. 1 shows an ideal case in which threshold voltage distributions do not overlap and have read voltage margins therebetween.

Referring to the flash memory example of FIG. 2, a memory cell may experience charge loss, where electrons trapped at a floating gate or tunnel oxide film are discharged over time. Such charge loss may accelerate when the tunnel oxide film deteriorates by iterative program and erase operations. Charge loss results in a decrease in the threshold voltages of memory cells. For example, as illustrated in FIG. 2, the threshold voltage distribution may be shifted left due to charge loss.

Further, program disturbance, erase disturbance and/or back pattern dependency also cause increases in threshold voltages. As characteristics of memory cells deteriorate, as described above, threshold voltage distributions of adjacent states may overlap, as illustrated in FIG. 2.

Once threshold voltage distributions overlap, read data may include a significant number of errors when a particular read voltage is applied to a selected word line. For example, when a memory cell is sensed in an 'on' state by a read voltage Vread3 that is applied to a selected word line, the memory cell is determined to have a second program state 'P2'. When a memory cell is sensed as an 'off' state by a read voltage Vread3 applied to a selected word line, the memory cell is determined to have a third program state 'P3'. However, when threshold voltage distributions overlap, the memory cell, which actually has the third program state 'P3', may be erroneously determined to have the second program state 'P2'. In short, when the threshold voltage distributions overlap as illustrated in FIG. 2, read data may include a significant number of errors.

What is therefore required is a scheme for reducing failure of read operations for data stored in memory cells of a semiconductor memory device.

SUMMARY

Various embodiments of the present invention are directed to a controller, a semiconductor memory system, and an operating method thereof capable of reducing failures of read operations for data stored in memory cells of a semiconductor memory device.

In accordance with an embodiment of the present invention, an operating method of a memory controller may include performing a soft read operation to read data stored in a semiconductor memory device using a soft read voltage, performing a soft decision ECC decoding operation to the read data based on a first log likelihood ratio (LLR) value, and performing the soft decision ECC decoding operation to the read data based on a second LLR value when the soft decision ECC decoding operation based on the first LLR value fails. The first and second LLR values may be selected between a default LLR value and an updated LLR value. The updated LLR value may be generated on a basis of numbers of error bits and non-error bits of the read data, which are obtained through the soft decision ECC decoding operation to the read data.

Preferably, the first LLR value may be the default LLR value.

Preferably, the first LLR value may be one of the default LLR value and the updated LLR value, which is used for a successful soft decision ECC decoding operation previously performed.

Preferably, the default LLR value and the updated LLR value may be stored in a default LLR table and an updated LLR table of the memory controller, respectively.

The operating method may further include generating or updating the updated LLR value when the soft decision ECC decoding operation based on the first or second LLR value is successful.

Preferably, the updated LLR value may be generated or updated according to following Equation.

$$\text{updated } LLR = \alpha \cdot \log \frac{\text{\# of Error Bits}}{\text{\# of Non-Error Bits}} \quad \text{[Equation]}$$

$$\alpha = \begin{cases} -1 : \text{when the soft level} < \text{the Read bias} \\ 1 : \text{when the soft level} > \text{the Read bias} \end{cases},$$

wherein the "# of Error Bits" is the number of the error bits, and the "# of Non-Error Bits" is the number of the non-error bits, and the "soft level" is the soft read voltage, and the "Read bias" is a reference voltage.

Preferably, the generating of updating of the updated LLR value may include determining whether to generate or update the updated LLR value, and generating or updating the updated LLR value based on a determination result.

Preferably, whether to generate or update the updated LLR value may be determined based on a number of error-corrected bits in the read data as a success of the soft decision ECC decoding operation, and one or more of a first number of times the soft read operation is performed until the success of the soft decision ECC decoding operation, and a second number of iterations of the soft decision ECC decoding operation until the success of the soft decision ECC decoding operation.

Preferably, the updated LLR value may be generated or updated when one or more of the first number of times and the second number of iterations are greater than a predetermined threshold with reference to the number of error-corrected bits.

Preferably, the soft decision ECC decoding operation may be a low density parity check (LDPC) decoding operation.

In accordance with an embodiment of the present invention, a memory controller may include a first means suitable for performing a soft read operation to read data stored in a semiconductor memory device using a soft read voltage, a second means suitable for performing a soft decision ECC decoding operation to the read data based on a first log likelihood ratio (LLR) value, and a third means suitable for performing the soft decision ECC decoding operation to the read data based on a second LLR value when the soft decision ECC decoding operation based on the first LLR value fails. The memory controller may select the first and second LLR values between a default LLR value and an updated LLR value. The memory controller may generate the updated LLR value on a basis of numbers of error bits and non-error bits of the read data, which are obtained through the soft decision ECC decoding operation to the read data.

Preferably, the first LLR value may be the default LLR value.

Preferably, the first LLR value may be one of the default LLR value and the updated LLR value, which is used for a successful soft decision ECC decoding operation previously performed.

Preferably, the default LLR value and the updated LLR value may be stored in a default LLR table and an updated LLR table, respectively.

The memory controller may further include a fourth means suitable for generating or updating the updated LLR value when the soft decision ECC decoding operation based on the first or second LLR value is successful.

Preferably, the fourth means may generate or update the updated LLR value according to following Equation.

$$\text{updated } LLR = \alpha \cdot \log \frac{\text{\# of Error Bits}}{\text{\# of Non-Error Bits}} \quad \text{[Equation]}$$

$$\alpha = \begin{cases} -1 : \text{when the soft level} < \text{the Read bias} \\ 1 : \text{when the soft level} > \text{the Read bias} \end{cases},$$

wherein the "# of Error Bits" is the number of the error bits, and the "# of Non-Error Bits" is the number of the non-error bits, and the "soft level" is the soft read voltage, and the "Read bias" is a reference voltage.

Preferably, the fourth means may include a fifth means suitable for determining whether to generate or update the updated LLR value, and a sixth means suitable for generating or updating the updated LLR value according to a determination result of the fifth means.

Preferably, the fifth means determines whether to generate or update the updated LLR value based on a number of error-corrected bits in the read data as a success of the soft decision ECC decoding operation and one or more of a first number of times the soft read operation is performed until the success of the soft decision ECC decoding operation, and a second number of iterations of the soft decision ECC decoding operation until the success of the soft decision ECC decoding operation.

Preferably, the fifth means may determine to generate or update the updated LLR value when one or more of the first number of times and the second number of iterations are greater than a predetermined threshold with reference to the number of error-corrected bits.

Preferably, the soft decision ECC decoding operation may be a low density parity check (LDPC) decoding operation.

In accordance with various embodiments of the present invention, failure of read operations for data stored in memory cells of a semiconductor memory device may be reduced.

DETAILED DESCRIPTION

Figure 1:
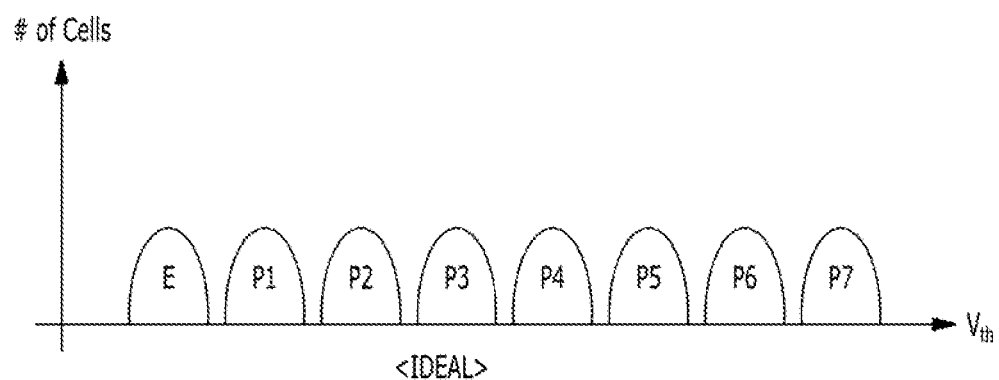
FIG. 1 is a threshold voltage distribution diagram schematically illustrating program and erase states of a 3-bit multi-level cell (3-bit MLC) in a nonvolatile memory device.
Figure 2:
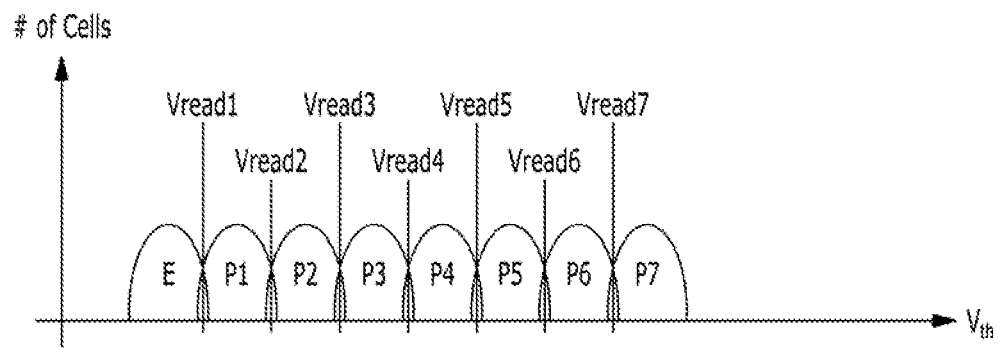
FIG. 2 is a threshold voltage distribution diagram schematically illustrating program and erase states of a 3-bit MLC having deteriorated characteristics in a nonvolatile memory device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. The drawings are not necessarily to scale and, in some instances, proportions may have been exaggerated in order to clearly illustrate features of the embodiments. Throughout the disclosure, like reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence. It should be readily understood that the meaning of "on" and "over" In the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to a where the first layer is formed directly on the second layer or the substrate but also to where a third layer exists between the first layer and the second layer or the substrate.

Figure 3:
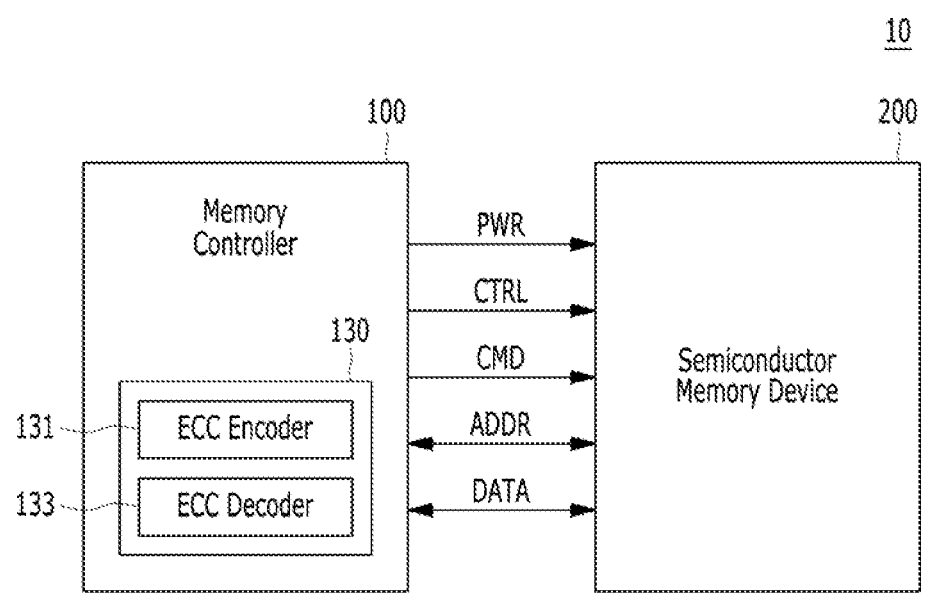
FIG. 3 is a block diagram schematically illustrating a semiconductor memory system in accordance with an embodiment of the present invention.

FIG. 3 is a block diagram schematically illustrating a semiconductor memory system 10 in accordance with an embodiment of the present invention.

Figure 4A:
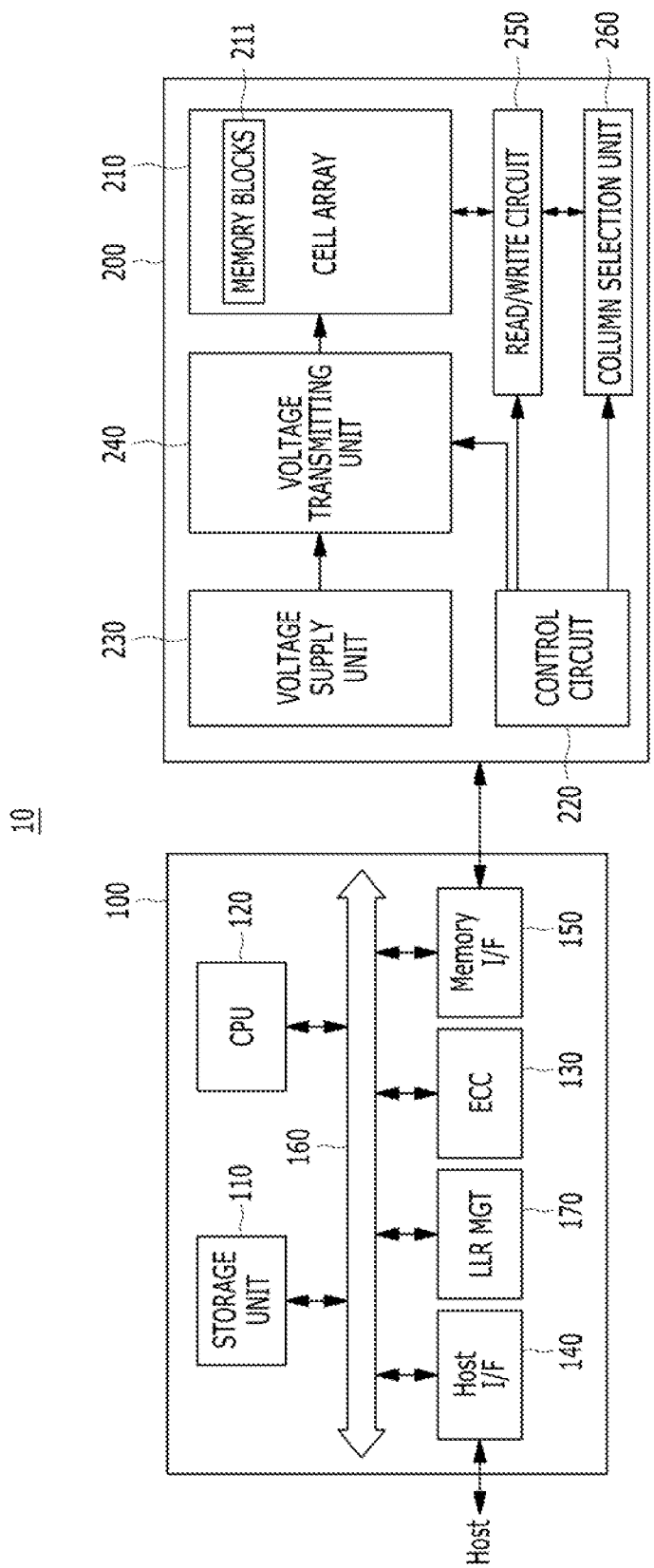
FIG. 4A is a detailed block diagram illustrating a semiconductor memory system shown in FIG. 3.

FIG. 4A is a detailed block diagram illustrating the semiconductor memory system 10 shown in FIG. 3.

Figure 4B:
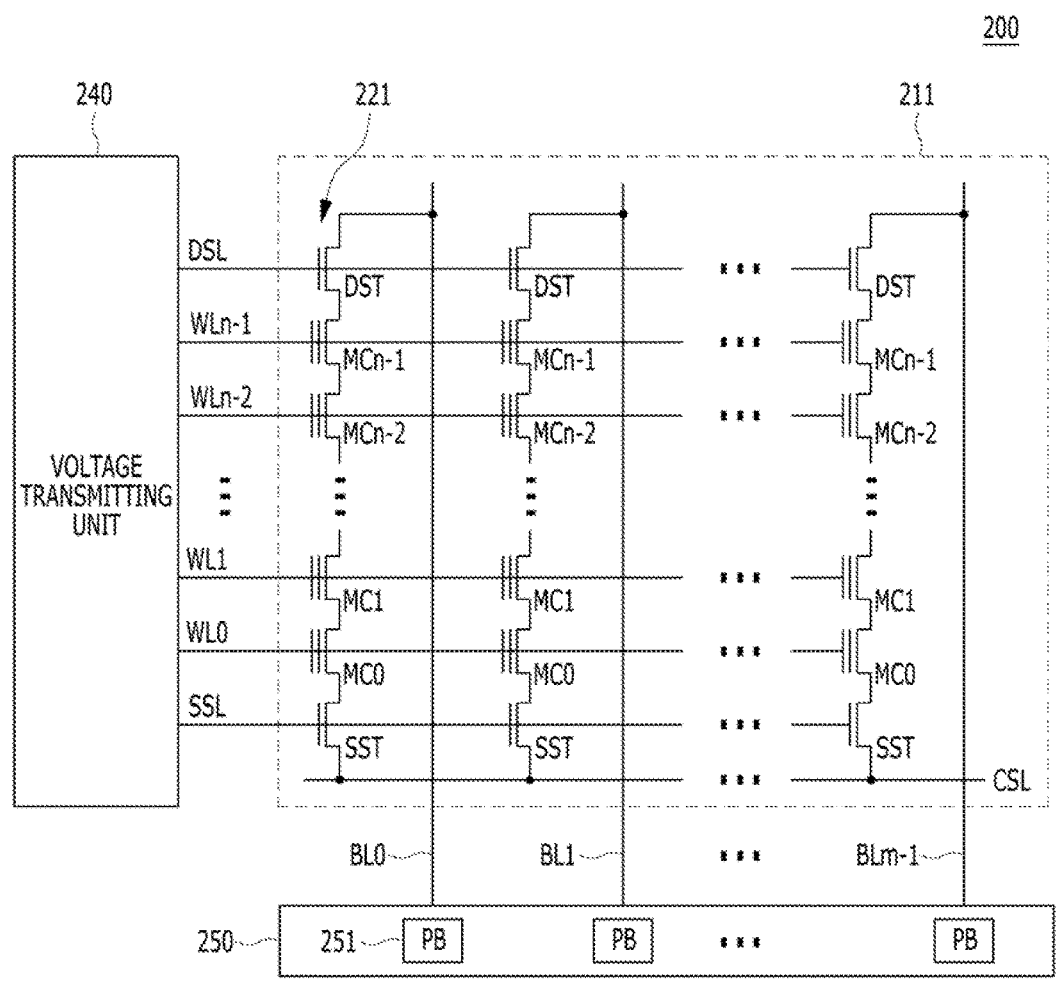
FIG. 4B is a circuit diagram illustrating a memory block shown in FIG. 4A.

FIG. 4B is a circuit diagram illustrating a memory block 211 shown in FIG. 4A.

Figure 5:
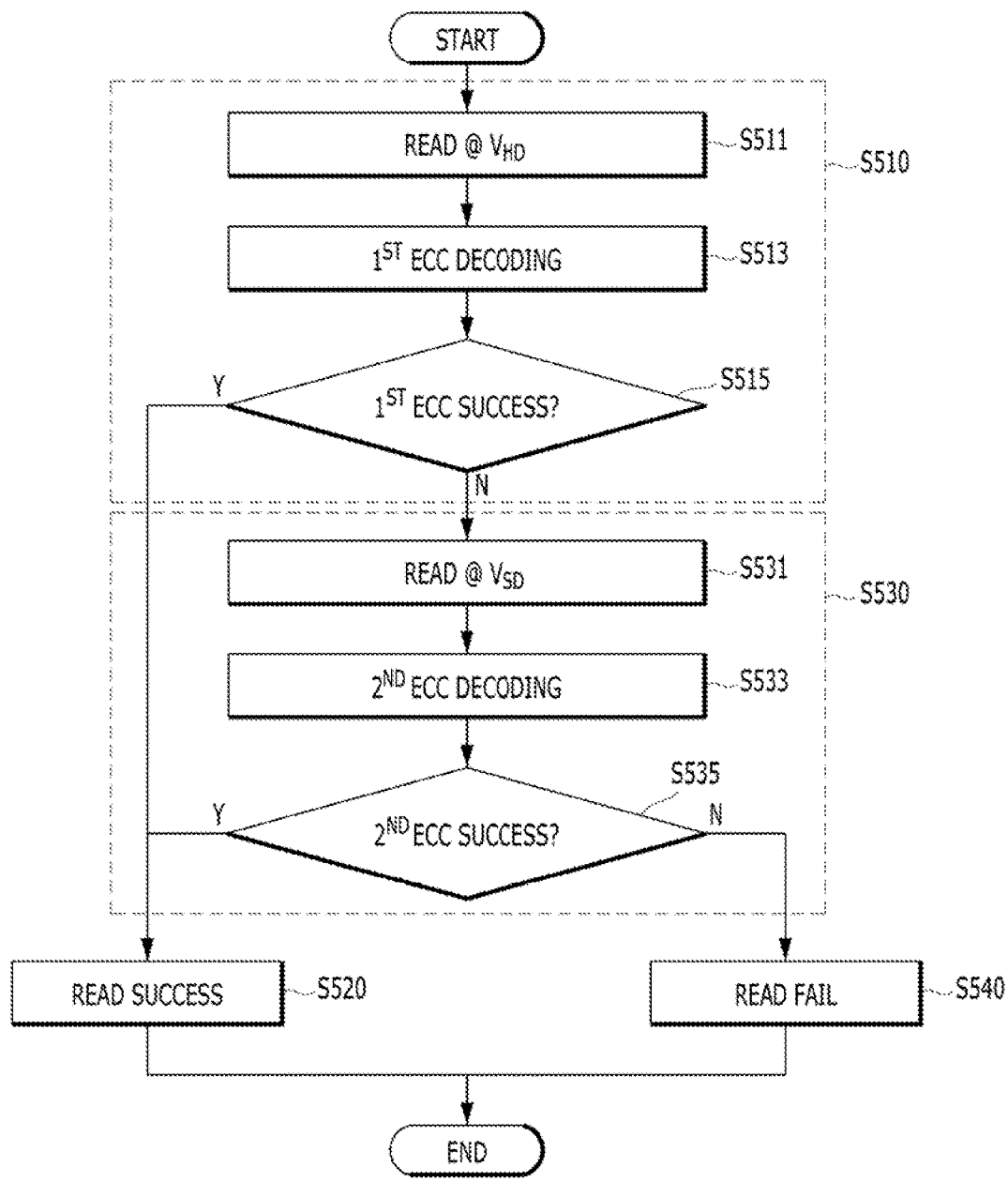
FIG. 5 is a flowchart illustrating an operation of a memory controller shown in FIG. 4A.

FIG. 5 is a flowchart illustrating an operation of the memory controller 100 shown in FIG. 4A.

Referring FIGS. 3 and 5, the semiconductor memory system 10 may include a semiconductor memory device 200 and the memory controller 100.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal CTRL may include a command latch enable (CLE) signal, an address latch enable (ALE) signal, a chip enable (CE) signal, a write enable (WE) signal, a read enable (RE) signal, and so on.

The memory controller 100 may control overall operations of the semiconductor memory device 200. The memory controller 100 may include an ECC unit 130 for correcting error bits. The ECC unit 130 may include an ECC encoder 131 and an ECC decoder 133.

The ECC encoder 131 may perform error correction encoding on data to be programmed into the semiconductor memory device 200 to output data to which parity bits are added. The parity bits may be stored in the semiconductor memory device 200.

The ECC decoder 133 may perform error correction decoding on data read from the semiconductor memory device 200. The ECC decoder 133 may determine whether the error correction decoding is successful, and may output an instruction signal based on the determination result. The ECC decoder 133 may correct error bits of data using parity bits generated at the ECC encoding.

When the number of error bits exceeds error correction capacity of the ECC unit 130, the ECC unit 130 may not correct the error bits. In this case, the ECC unit 130 may generate an error correction fail signal.

The ECC unit 130 may correct an error through a coded modulation such as a low-density parity-check (LDPC) code, a Bose-Chaudhuri-Hocquenghem (BCH) code, a turbo code, a Reed-Solomon (RS) code, a convolutional code, a recursive systematic convolutional (RSC) code, a trellis-coded modulation (TCM), a block coded modulation (BCM), and so on. The ECC unit 130 may include all circuits, systems, or devices for error correction.

In accordance with an embodiment of the present invention, the ECC unit 130 may perform an error bit correcting operation using hard decision data and soft decision data.

The memory controller 100 and the semiconductor memory device 200 may be integrated in a single semiconductor device. For example, the memory controller 100 and the semiconductor memory device 200 may be integrated in a single semiconductor device such as a solid-state drive (SSD). The solid state drive may include a storage device for storing data in a semiconductor memory. When the semiconductor memory system 10 is used in an SSD, operation speed of a host (not shown) coupled to the semiconductor memory system 10 may be improved.

For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the semiconductor memory system 10 may be provided as one of various elements comprising an electronic device such as a computer, an ultra-mobile PC (UMPC), a workstation, a netbook, a personal digital assistant (PDA), a portable computer, a web tablet computer, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, an radio-frequency identification (RFID) device, or one of electronic devices of a computing system.

Referring to FIG. 4A, the memory controller 100 may include a storage unit 110, a CPU 120, the ECC unit 130, a host interface (I/F) 140, a memory interface (I/F) 150, a system bus 160 and a log likelihood ratio (LLR) management (MGT) unit 170. The storage unit 110 may operate as a working memory of the CPU 120.

The host interface 140 may communicate with a host through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The ECC unit 130 may detect and correct an error included in the data read from the semiconductor memory device 200. The memory interface 150 may interface with the semiconductor memory device 200. The CPU 120 may perform various control operations.

The LLR management unit 170 may determine whether to update a LLR table used at the success of the soft decision ECC decoding operation, may update the LLR table when needed, and may determine which one of LLR tables to be used at the next soft decision ECC decoding operation. The LLR tables may be stored in one of the storage unit 110 and the LLR management unit 170. The LLR management unit 170 may be mounted in the ECC unit 130.

The semiconductor memory device 200 may include a memory cell array 210, a control circuit 220, a voltage supply unit 230, a voltage transmitting unit 240, a read/write circuit 250, and a column selection unit 260.

The memory cell array 210 may include a plurality of memory blocks 211. User data may be stored in the memory block 211.

Referring to FIG. 4B, the memory block 211 may include a plurality of cell strings 221 coupled to bit lines BL0 to BLm−1, respectively. The cell string 221 of each column may include one or more drain selection transistors DST and one or more source selection transistors SST. A plurality of memory cells MC0 to MCn−1 (or memory cell transistors) may be serially coupled between the selection transistors DST and SST. Each of the memory cells MC0 to MCn−1 may be formed of a multi-level cell (MLC) storing data Information of multiple bits in each cell. The cell strings 221 may be electrically coupled to the bit lines BL0 to BLm−1, respectively.

FIG. 4B exemplarily illustrates a memory block 211 comprising a NAND-type flash memory cell. However, the memory block 211 of the semiconductor memory device 200 is not be limited being NAND flash memory, but may comprise NOR-type flash memory, hybrid flash memory in which two or more types of memory cells are combined, and one-NAND flash memory in which a controller is embedded inside a memory chip. Operation characteristics of the semiconductor device may be applied to a charge trap flash (CTF) in which a charge storing layer is formed by an insulating layer, as well as the flash memory device in which a charge storing layer is formed by a conductive floating gate.

Referring back to FIG. 4A, the control circuit 220 may control overall operations related to program, erase, and read operations of the semiconductor memory device 200.

According to operation modes, the voltage supply unit 230 may provide word line voltages, for example, a program voltage, a read voltage, and a pass voltage, to the respective word lines, and may provide a voltage to a bulk, for example, a well region in which the memory cells are formed. A voltage generating operation of the voltage supply unit 230 may be performed under control of the control circuit 220.

The voltage supply unit 230 may generate a plurality of variable read voltages for generating a plurality of read data.

The voltage transmitting unit 240 may select one of the memory blocks 211 (or sectors) of the memory cell array 210, and may select one of the word lines of the selected memory block under the control of the control circuit 220. The voltage transmitting unit 240 may provide the word line voltages generated from the voltage supply unit 230 to selected word lines or non-selected word lines under the control of the control circuit 220.

The read/write circuit 250 may be controlled by the control circuit 220 and may operate as a sense amplifier or a write driver according to an operation mode. For example, during a verification/read operation, the read/write circuit 250 may operate as a sense amplifier for reading data from the memory cell array 210. During the read operation, the column selection unit 260 may output the data read from the read/write circuit 250 to the outside, for example, the memory controller 100, based on column address information. On the other hand, during the verification operation, the read data may be provided to a pass/fail verification circuit (not illustrated) included in the semiconductor memory device 200, and be used for determining whether a program operation of the memory cell succeeds.

During the program operation, the read/write circuit 250 may operate as a write driver for driving the bit lines based on data to be stored in the memory cell array 210. During the program operation, the read/write circuit 250 may receive the data to be written in the memory cell array 210 from a buffer (not illustrated), and may drive the bit lines based on the received data. To this end, the read/write circuit 250 may include a plurality of page buffers (PB) 251 corresponding to the columns (or the bit lines) or column pairs (or bit line pairs), respectively. A plurality of latches may be included in each of the page buffers 251.

Referring to FIGS. 4A and 5, the operation of the memory controller 100 may include a first ECC decoding step S510, and may additionally include a second ECC decoding step S530.

For example, the first ECC decoding step S510 may be hard decision ECC decoding for data of a predetermined length, which is read from a memory cell of the memory block 211 by a hard read voltage $V_{HD}$. The first ECC decoding step S510 may include steps S511 to S515.

For example, the second ECC decoding step S530 may be a soft decision ECC decoding for the data by forming soft decision data using soft read voltages $V_{SD}$ around the hard read voltage $V_{HD}$ when the hard decision ECC decoding of the first ECC decoding step S510 finally fails. The second ECC decoding step S530 may include steps S531 to S535.

At step S511, the data may be read from the semiconductor memory device 200 by the hard read voltage $V_{HD}$. The memory controller 100 may provide a read command and an address to the semiconductor memory device 200. The semiconductor memory device 200 may read the data therefrom using the hard read voltage $V_{HD}$ in response to the read command and the address. The read data may be provided to the memory controller 100.

At step S513, the hard decision ECC decoding as the first ECC decoding may be performed. The ECC unit 130 may perform the hard decision ECC decoding to the data (hereinafter "hard read data"), which is read from the semiconductor memory device 200 by the hard read voltage $V_{HD}$, by using an error correction code.

At step S515, it may be determined whether the hard decision ECC decoding succeeds or fails. That is, at step S515, it may be determined whether an error of the data (hereinafter "hard read and decoded data"), which is decoded from the hard read data through the hard decision ECC decoding at step S513, is corrected. For example, the memory controller 100 may determine whether the error of the hard read and decoded data is corrected by using a parity check matrix. For example, when product result of the parity check matrix and the hard read and decoded data is a zero vector ('0'), it may be determined that the hard read and decoded data is corrected. On the other hand, when product result of the parity check matrix and the hard read and decoded data is not the zero vector ('0'), it may be determined that the hard read and decoded data is not corrected.

When it is determined that the hard read and decoded data is corrected as the result of determination of step S515, it may be determined at step S520 that the read operation by the hard read voltage $V_{HD}$ at step S511 is successful and the operation of the memory controller 100 may end. The hard read and decode data may now be the error-corrected data and may be provided externally or used in the memory controller 100.

When it is determined that the hard read and decoded data is not corrected as the result of determination of step S515, the second ECC decoding step S530 may be performed.

At step S531, the data may be read from the semiconductor memory device 200 by the soft read voltages $V_{SD}$. For example, the additional read operation by the soft read voltages $V_{SD}$ may be performed to the memory cell, to which the first ECC decoding step S510 by the hard read voltage $V_{HD}$ is performed. The soft read voltages $V_{SD}$ may have different levels from the hard read voltage $V_{HD}$.

At step S533, the soft decision ECC decoding as the second ECC decoding may be performed. The soft decision ECC decoding may be performed based on data comprising the hard read data and soft read data read from the memory cell by the soft read voltages $V_{SD}$. The hard read voltage $V_{HD}$ and the soft read voltages $V_{SD}$ may have different levels.

For example, each of the memory cells MC0 to MCn−1 of the semiconductor memory device 200 may belong to one of the threshold voltage distributions including 7 program states P1 to P7 and 1 erase state E.

The hard read voltage $V_{HD}$ may have a level between 2 neighbouring states of the plurality of states (E and P1 to P7). Each of the soft read voltages $V_{SD}$ may have the level between 2 neighbouring states of the plurality of states (E and P1 to P7), which is different from the hard read voltage $V_{HD}$.

The hard read data read from the memory cells MC0 to MCn−1 by the hard read voltage $V_{HD}$ and the soft read data read therefrom by the soft read voltages $V_{SD}$ may have different values. For example, there may be a tailed one of the memory cells MC0 to MCn−1 having the threshold voltage higher or lower than the threshold voltage distribution of the normal logic state. The hard read data read from the tailed memory cell by the hard read voltage $V_{HD}$ and the soft read data read therefrom by the soft read voltages $V_{SD}$ may have different values. When the additional read operation by the soft read voltages $V_{SD}$ is performed as well as the read operation by the hard read voltage $V_{HD}$, additional information on the threshold voltages of the memory cells MC0 to MCn−1, i.e., the tailed memory cell, may be obtained.

When the additional information is obtained, the probability that the data of the memory cells MC0 to MCn−1 belong to a first state, i.e., '1', or a second state, i.e., '0', that is, the likelihood ratio may increase. That is, the reliability of the ECC decoding may increase. The memory controller 100 may perform the soft decision ECC decoding based on the hard read data by the hard read voltage $V_{HD}$ and the soft read data by the soft read voltages $V_{SD}$.

At step S535, it may be determined whether the soft decision ECC decoding succeeds or fails. That is, at step S535, it may be determined whether an error of the data (hereinafter "soft read and decoded data", which is decoded form the soft read data through the soft decision ECC decoding at step S533, is corrected. For example, the memory controller 100 may determine whether the error of the soft read and decoded data is corrected by using the parity check matrix. For example, when the product result of the parity check matrix and the soft read and decoded data is the zero vector ('0'), it may be determined that the soft read and decoded data is corrected. On the other hand, when the product result of the parity check matrix and the soft read and decoded data is not the zero vector ('0'), it may be determined that the soft read and decoded data is not corrected.

The product process of the parity check matrix and the hard read and decoded data during the first ECC decoding step S510 may be the same as the product process of the parity check matrix and the soft read and decoded data during the second ECC decoding step S530.

When it is determined that the soft read and decoded data is corrected as the result of determination of step S535, it may be determined at step S520 that the read operation by the soft read voltage $V_{SD}$ at step S531 is successful and the operation of the memory controller 100 may end. The soft read and decoded data may now be the error-corrected data and may be provided externally or used in the memory controller 100.

When it is determined that the soft read and decoded data is not corrected as the result of determination of step S535, it may be determined at step S540 that the read operation of the memory controller 100 to the memory cells MC0 to MCn−1 finally fails and the operation of the memory controller 100 may end.

Figure 6A:
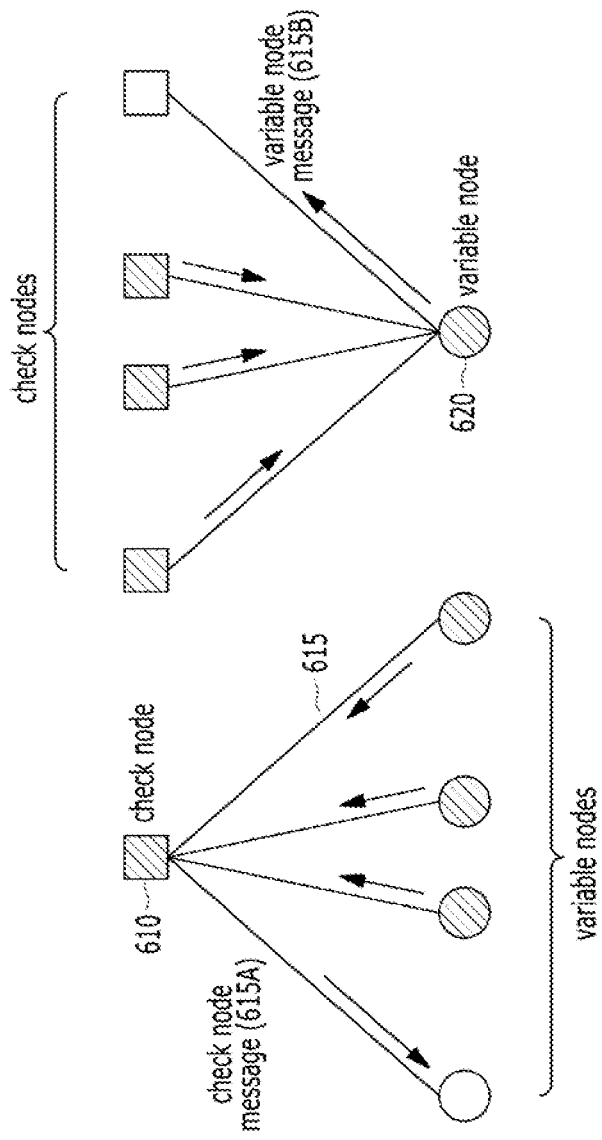
FIG. 6A is a schematic diagram illustrating LDPC decoding expressed by a tanner graph.

FIG. 6A is a schematic diagram illustrating LDPC decoding expressed by a tanner graph.

Figures 6B, 6C:
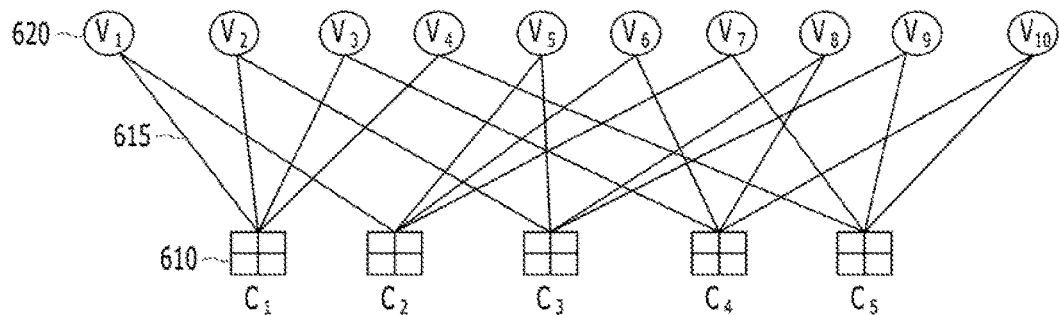
FIG. 6B is a schematic diagram illustrating an LDPC code.
FIG. 6C is a schematic diagram illustrating a syndrome check process according to LDPC decoding.

FIG. 6B is a schematic diagram illustrating an LDPC code.

FIG. 6C is a schematic diagram illustrating a syndrome check process according to the LDPC decoding.

An error correction code (ECC) is commonly used in storage systems. Various physical phenomena occurring in storage devices result in noise effects that corrupt the stored information. Error correction coding schemes can be used for protecting the stored Information against the errors. This is done by encoding the information before storing the information in the memory device. The encoding process transforms the information bit sequence into a codeword by adding redundancy to the information. This redundancy can then be used in order to recover the information from the possibly corrupted codeword through a decoding process.

In iterative coding schemes, the code is constructed as a concatenation of several simple constituent codes and is decoded based on an iterative decoding algorithm by exchanging information between decoders receiving the simple constituent codes. Usually, the code can be defined using a bipartite graph or a tanner graph describing interconnections between the constituent codes. In this case, decoding can be viewed as an iterative message passing over the graph edges.

The iterative codes may include a low-density parity-check (LDPC) code. The LDPC code is a linear binary block code defined by a sparse parity-check matrix H.

Referring to FIG. 6A, the LDPC code has a parity check matrix including a very small number of is in each row and column, and its structure can be defined by the tanner graph including check nodes 610, variable nodes 620, and edges 615 for connecting the check nodes 610 to the variable nodes 620. A value delivered from the check node 610 to the variable node 620 after check node processing becomes a check node message 615A, and a value delivered from the variable node 620 to the check node 610 after variable node processing becomes a variable node message 615B.

An initial message is an input log likelihood ratio (LLR) processed by the variable node 620. The LLR will be described later in detail.

A decoding process of the LDPC code is performed by iterative decoding based on a 'sum-product' algorithm. A decoding method can be provided based on a suboptimal message-passing algorithm such as a 'min-sum' algorithm, which is a simplified version of the sum-product algorithm.

For example, referring to FIG. 6B, the tanner graph of the LDPC code includes 5 check nodes 610 representing parity check equations of the LDPC code, 10 variable nodes 620 representing code symbols, and edges 615 representing relationships between the check nodes 610 and the variable nodes 620. The edges 615 connect each check node 610 to corresponding ones of the variable node 620, which represent code symbols included in the parity check equation represented by the check node 610. FIG. 6B exemplarily illustrates a regular LDPC code in which the number of variable nodes 620 coupled to each of the check nodes 610 is fixed at 4 and the number of the check nodes 610 coupled to each of the variable nodes 620 is fixed at 2.

FIG. 6C shows a parity check matrix H corresponding to the tanner graph. The parity check matrix H is similar to the graphic expression of the parity check equations. In the parity check matrix H, the same number of 1s are included in both columns and rows. That is, each column of the parity check matrix H has two 1s corresponding to the connections between each of the variable nodes 620 and the check nodes 610, and each row has four 1s corresponding to the connections between each of the check nodes 610 and the variable nodes 620.

A process of decoding the LDPC code is performed by iterating a process of exchanging messages, which are generated and updated in each node, between the variable nodes 620 and the check nodes 610 in the tanner graph. In this case, each node updates the messages based on the sum-product algorithm or a similar suboptimal algorithm.

The LDPC decoding on data having a predetermined length, which is read from the memory cell of the memory block 211 by a first hard read voltage $V_{HD}$, may comprise a plurality of iterations, each of which includes an update of the check nodes 610, an update of the variable nodes 620, and a syndrome check, after an initial update of the variable nodes 620. After the single iteration, when the result of the syndrome check satisfies a predetermined condition, the LDPC decoding may end. When the result of the syndrome check does not satisfy the predetermined condition, another single iteration may be performed on the memory cell of the memory block 211. The number of iterations may be limited to a maximum read count. When the result of the syndrome check does not satisfy the predetermined condition until the number of iterations reaches the maximum read count, the LDPC decoding on the data may be determined to have failed in ECC decoding.

Referring to FIG. 6C, the syndrome check is a process of identifying whether the product result $Hv^t$ of the parity check matrix H and a vector "v", which is obtained by the update of the variable nodes 620, satisfies the predetermined condition. When the product result $Hv^t$ of the parity check matrix H and the vector "v" becomes the zero vector ('0'), the product result $Hv^t$ may be evaluated to satisfy the predetermined condition.

FIG. 6C shows the syndrome check process. FIG. 6C exemplarily shows a non-zero vector "01000" as the product result $Hv^t$, and thus FIG. 6C shows that the syndrome check does not satisfy the predetermined condition and another single iteration should be performed.

Figure 7A:
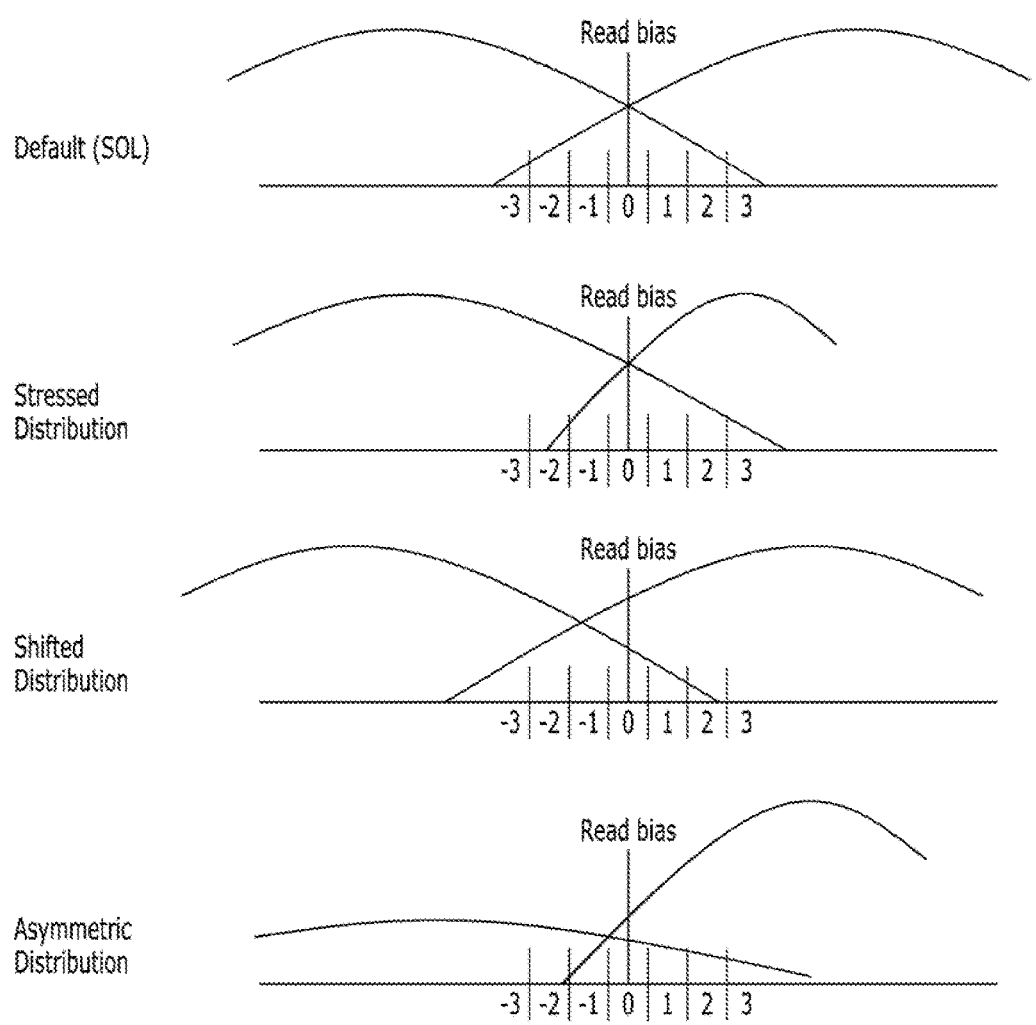
FIG. 7A is a schematic diagram illustrating various aspects of threshold voltage distributions of a memory cell and appropriate LLR values corresponding to the threshold voltage distributions.

FIG. 7A is a schematic diagram illustrating various aspects of threshold voltage distributions of a memory cell and appropriate LLR values corresponding to the threshold voltage distributions.

Figure 7B:
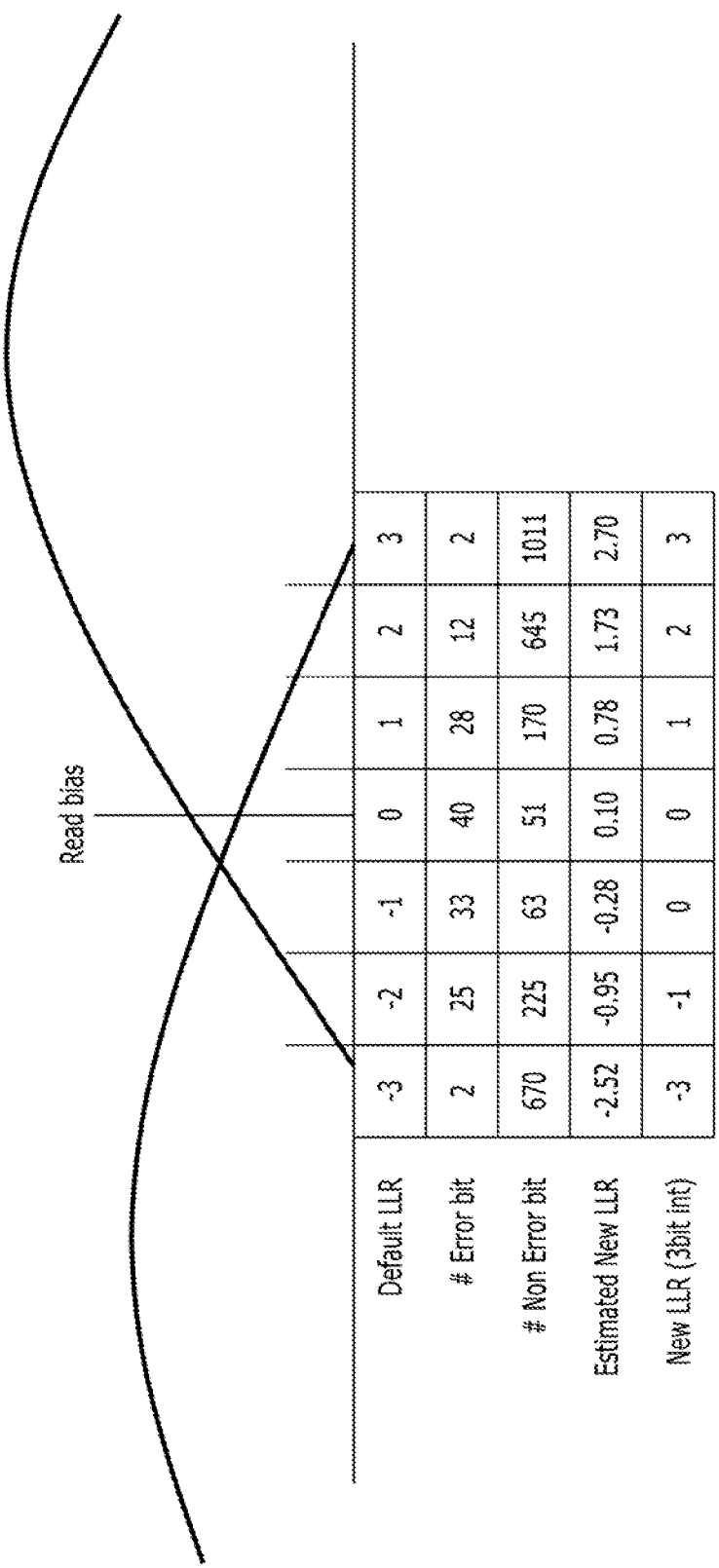
FIG. 7B is a schematic diagram illustrating update of LLR values in accordance with an embodiment of the present invention.

FIG. 7B is a schematic diagram illustrating update of the LLR values in accordance with an embodiment of the present invention.

Figure 7C:
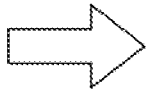
FIG. 7C is a schematic diagram illustrating the process of obtaining numbers of error bits and non-error bits of each LLR value in accordance with an embodiment of the present invention.

FIG. 7C is a schematic diagram illustrating a process of obtaining numbers of error bits and non-error bits of each LLR value in accordance with an embodiment of the present invention.

As described above with reference to FIG. 5, the second ECC decoding step S530 may be a step of a soft decision ECC decoding for the data by forming soft decision data using soft read voltages $V_{SD}$ around the hard read voltage $V_{HD}$ when the hard decision ECC decoding of the first ECC decoding step S510 finally fails.

The soft decision ECC decoding may be performed by the plurality of soft read voltages $V_{SD}$, each of which is spaced apart from a predetermined hard read voltage $V_{HD}$ by the amount of different quantization intervals in voltage level. For example, the low-density-parity-check (LDPC) decoding, which is one of the soft decision ECC decoding techniques applicable to the NAND flash memory device, has great performance by performing the soft decision ECC decoding in an iterative way based on the soft read data or the log likelihood ratio (LLR).

During the LDPC decoding, the LLR may be generated through the read operation to the memory cells by the plurality of soft read voltages $V_{SD}$, each of which has the different quantization interval from the predetermined hard read voltage $V_{HD}$.

FIG. 7A exemplarily illustrates threshold voltage distributions of the memory cells and the read voltages for reading data stored in the memory cells. The read voltages exemplarily include the single predetermined hard read voltage ("Read bias") and six soft read voltages $V_{SD}$, each having the different quantization intervals from the predetermined hard read voltage ("Read bias"). The six soft read voltages $V_{SD}$ form seven soft level sections corresponding to seven LLR values, which are integers ranging from −3 to 3. Levels of the soft read voltages $V_{SD}$ or the soft levels may be determined by the magnitudes of the quantization intervals, respectively.

Also, FIG. 7A exemplarily shows appropriate LLR values corresponding to the various aspects of the threshold voltage distributions. The LLR values may represent a probabilistic index where data read from a memory cell is "1" or "0", and may be represented by Equation 1.

$$LLR = \log \frac{p(x=0)}{p(x=1)} \quad \text{[Equation 1]}$$

When the LLR value expressed by Equation 1 is a positive number, the probability of the read data being "0" is relatively high. When the LLR value is a negative number, the probability of the read data being "1" is relatively high. The magnitude of the LLR value represents the reliability of the probability. The greater the magnitude of the LLR value, the greater the reliability of the probability.

For example, as shown in FIG. 7A, the negative LLR value corresponding to a lower threshold voltage distribution than the predetermined hard read voltage ("Read bias") may represent that the data read by lower read voltage than the predetermined hard read voltage ("Read bias") has a higher probability of being "1". On the other hand, the positive LLR value corresponding to higher threshold voltage distribution than the predetermined hard read voltage ("Read bias") may represent that the data read by higher read voltage than the predetermined hard read voltage ("Read bias") has a higher probability of being "0".

Intuitively, it is relatively hard to determine data read by the read voltages of an overlapping section of the threshold voltage distributions of FIG. 7A to be "0" or "1", and it is hard to depend on the determination with good reliability. On the other hand, it is relatively easy to determine data read by the read voltages of a non-overlapping section of the threshold voltage distributions of FIG. 7A to be "0" or "1", and it is easy to depend on the determination with good reliability.

The reliability is expressed by the magnitude of the LLR value. For example, as shown in FIG. 7A, the magnitude of the LLR value becomes smaller as the threshold voltage distributions overlap more, and becomes greater as the threshold voltage distributions overlap less.

For example, the LLR value for the read data may be used in the LDPC decoding process. The LLR value for the read data may be used as an input value of the LDPC decoding process described above with reference to FIGS. 6A to 6C. The LDPC decoding process has an assumption that the magnitude of the LLR value is smaller when the read data has an error. Therefore, when the single iteration described with reference to FIGS. 6A to 6C fails, the memory controller 100 may change the LLR value based on the result of the single iteration and may perform the single iteration again based on the changed LLR value for error correction.

An initial LLR value may be determined under assumption of an initial aspect of the threshold voltage distribution of the memory cell. For example, as shown in FIG. 7A, for the threshold voltage distribution of the memory cell having the state of "start of life (SOL)", the soft level sections may be placed on the centre of the overlapping section of the threshold voltage distribution.

The initial aspect of the threshold voltage distribution may become deformed or distorted by the deterioration of the memory cell characteristics. In this case, the error correction may not succeed with the initial LLR value. Due to various reasons, the threshold voltage distribution may be deformed or distorted such as the "Stressed Distribution", "Shifted Distribution" and "Asymmetric Distribution" exemplarily shown in FIG. 7A. The soft level sections and the corresponding LLR values should be updated according to the deformation or distortion of the threshold voltage distribution. The error correction through the updated LLR value according to the deformation or distortion of the threshold voltage distribution may have a higher chance of success than the error correction through the initial LLR value.

The soft level sections may be changed on the basis of the predetermined hard read voltage ("Read bias"), which may be determined according to the deformation or distribution of the threshold voltage distribution.

FIG. 7B exemplarily illustrates a process of updating the LLR value of the soft level sections in accordance with an embodiment of the present invention when there is deformation or distortion of the threshold voltage distribution of the memory cell.

Referring to FIG. 7B, default LLR values ("Default LLR") are exemplarily set to seven integers ranging from −3 to 3, which correspond to seven soft level sections, respectively.

When the memory controller 100 performs the ECC decoding operation to the read data from the memory cell having the deformed or distorted threshold voltage distribution as illustrated in FIG. 7B, binary bits of the read data may be classified into an error bit and a non-error bit for the respective LLR values corresponding to the soft level sections. The memory controller 100 may perform the ECC decoding operation to the read data by allocating the default LLR values ("Default LLR") to each binary bit of the read data, and may determine each binary bit of the read data as one of the error bit and the non-error bit. The detection of the error bit from the read data does not mean failure of the ECC decoding operation, which may succeed through the error correction of the detected error bit.

FIG. 7B exemplarily illustrates the number of the error bits ("# of Error bits") and the number of non-error bits ("# of Non Error bits") for each of the LLR values respectively corresponding to the soft level sections as a result of the ECC decoding operation. FIG. 7C exemplarily illustrates a process of obtaining the number of the error bits ("# of Error bits") and the number of non-error bits ("# of Non Error bits") for each of the LLR values respectively corresponding to the soft level sections.

Referring to FIG. 7C, when the binary bits of data ("Read data") read from the memory cell are "0 1 1 0 0 1 0 1 1", for example, the memory controller 100 may perform the ECC or LDPC decoding operation to the binary bits of the read data ("Read data") by allocating values "3 −3 −1 1 0 −2 3 −1 −2" as corresponding ones ("Corresponding LLR") of the default LLR values ("Default LLR") to respective binary bits of the read data ("0 1 1 0 0 1 0 1 1"), and may determine each binary bit of the read data as one of the error bit and the non-error bit. When decoded data ("Decoded data") as the result of the LDPC decoding operation is "0 1 1 1 0 1 0 0 1", the number of the error bits ("# of Error bits") and the number of non-error bits ("# of Non Error bits") may be obtained for each of the default LLR values respectively allocated to the binary bits. For example, FIG. 7C illustrates the number of the error bits ("# of Error bits") and the number of non-error bits ("# of Non Error bits") for the allocated default LLR value ("Default LLR") "−1" are "1s", respectively.

Referring back to FIG. 7B, in accordance with an embodiment of the present invention, the LLR values may be updated on the basis of the obtained numbers of the error bits ("# of Error bits") and non-error bits ("# of Non Error bits"). FIG. 7B exemplarily illustrates values "−2.52 −0.95 −0.28 0.10 0.78 1.73 2.70" as the updated LLR values ("Estimated New LLR"). Integer LLR values ("New LLR (3-bit int)") illustrated in FIG. 7B may be obtained from the updated LLR values ("Estimated New LLR") by rounding off the updated LLR values ("Estimated New LLR").

In accordance with an embodiment of the present invention, the LLR values may be updated through Equation 2.

$$\text{updated } LLR = \alpha \cdot \log \frac{\text{\# of Error Bits}}{\text{\# of Non-Error Bits}} \quad \text{[Equation 2]}$$

$$\alpha = \begin{cases} -1 : \text{when the soft level} < \text{the Read bias} \\ 1 : \text{when the soft level} > \text{the Read bias} \end{cases}$$

The result of Equation 2 may represent the LLR value, which may be estimated through the soft decision ECC decoding described above with reference to FIG. 5.

As described above, the soft decision ECC decoding may be performed by the plurality of soft read voltages $V_{SD}$, each of which is spaced apart from a predetermined hard read voltage $V_{HD}$ by the amount of different quantization interval in voltage level. Therefore, the memory controller 100 may perform the soft decision ECC decoding by performing a plurality of soft read operations using the plurality of soft read voltages $V_{SD}$, determining the soft level sections that the binary bits of the read data from the memory cells belong to, and allocating the LLR values corresponding to the determined soft level sections to the binary bits of the read data.

The LLR values to be allocated to the binary bits of the read data may be estimated according to Equation 3, which is based on Equation 1.

$$LLR = \log \frac{p(x=0)}{p(x=1)} \approx \log \frac{\text{\# of 0s}}{\text{\# of 1s}} \quad \text{[Equation 3]}$$

Equation 3 may be expressed as in the following Equation 4.

FIG. 7B exemplarily illustrates the seven soft level sections corresponding to seven integer LLR values ranging from −3 to 3. The seven soft level sections are formed by six soft read voltages $V_{SD}$, each of which is spaced apart from the predetermined hard read voltage ("Read bias") by the amount of different quantization interval in voltage level. For example, among the binary bits that the value "−2" of the default LLR value ("Default LLR") is allocated to as the result of the ECC decoding, the number of error bits ("# of Error bits") is 25 and the number of non-error bits ("# of Non Error bits") is 225. Intuitively, a bit determined as "1" is the non-error bit and a bit determined as "0" is the error bit in the soft level section, which corresponds to the value "−2" of the default LLR value ("Default LLR") and is lower in voltage level than the predetermined hard read voltage ("Read bias").

In the soft level section of the negative default LLR value ("Default LLR"), which is lower in voltage level than the predetermined hard read voltage ("Read bias"), a bit determined as "1" is the non-error bit and a bit determined as "0" is the error bit. Similarly, in the soft level section of the positive default LLR value ("Default LLR"), which is higher in voltage level than the predetermined hard read voltage ("Read bias"), a bit determined as "1" is the error bit and a bit determined as "0" is the non-error bit.

Therefore, Equation 3 using the number of bits determined as "0" and "1" may be expressed as Equation 4 using the number of the error bits and the non-error bits.

$$\log \frac{\text{\# of 0s}}{\text{\# of 1s}} = -(\text{sign of Default } LLR) \cdot \quad \text{[Equation 4]}$$
$$\log \frac{\text{\# of Error Bits}}{\text{\# of Non-Error Bits}}$$
$$= \alpha \cdot \log \frac{\text{\# of Error Bits}}{\text{\# of Non-Error Bits}}$$

Consequentially, in accordance with an embodiment of the present invention, the memory controller 100 may perform the soft decision ECC decoding by allocating default LLR values ("Default LLR") to the binary bits of the read data, respectively. As a result, the memory controller 100 may update the LLR values through the number of the error bits ("# of Error bits") and the number of non-error bits ("# of Non Error bits") for the allocated default LLR value ("Default LLR"), and Equation 2 or 4.

For example, as illustrated in FIG. 7B, when the number of error bits ("# of Error bits") is 25 and the number of non-error bits ("# of Non Error bits") is 225 among the binary bits that the value "−2" of the default LLR value ("Default LLR") is allocated to as the result of the ECC decoding, the value "−2" of the default LLR value ("Default LLR") may be updated to the value "−0.95" as the updated LLR values ("Estimated New LLR") or the value "−1" as the integer LLR values ("New LLR (3-bit Int)").

Figure 8A:
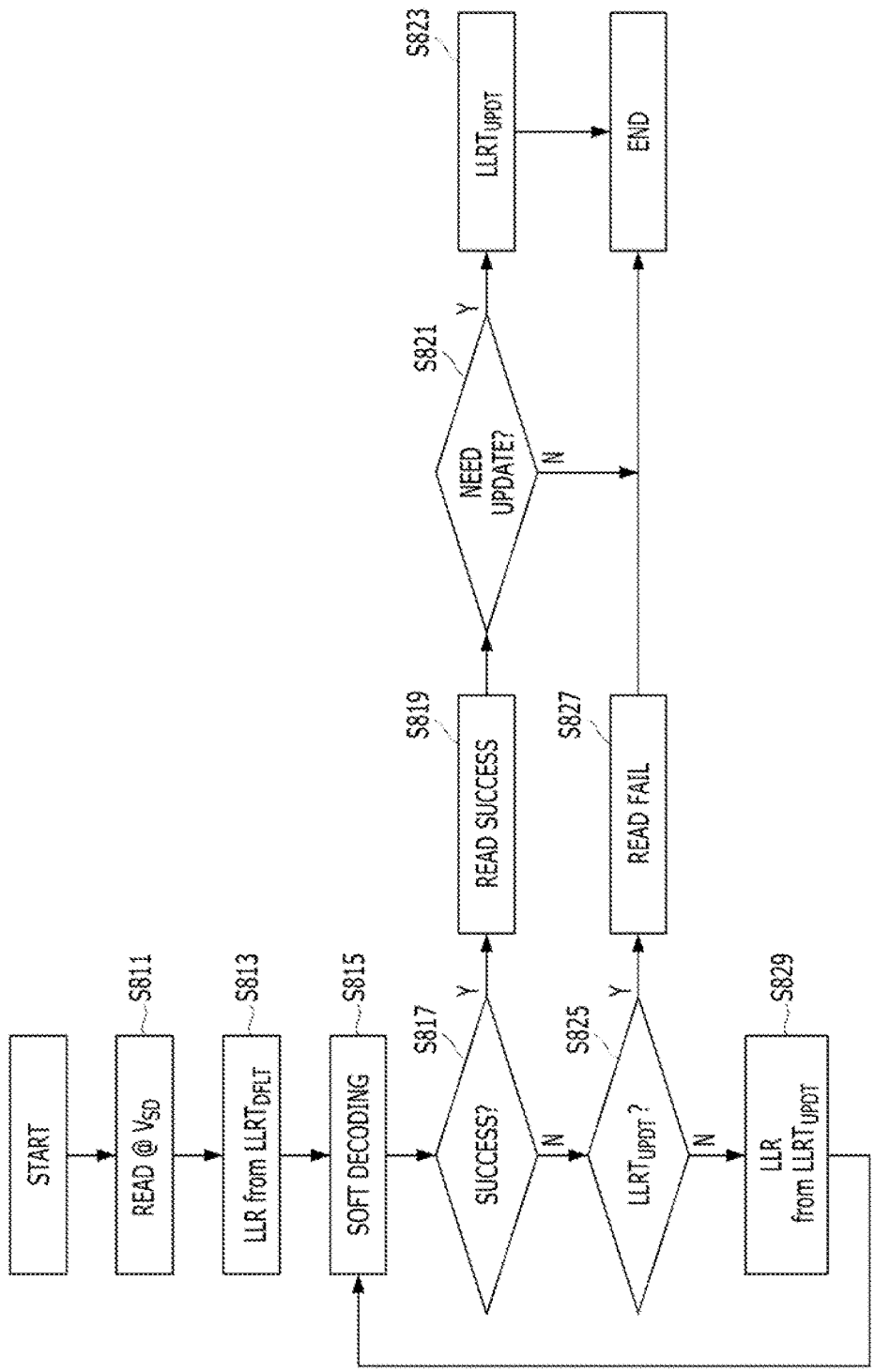
FIG. 8A is a flowchart illustrating an operation of a memory controller in accordance with an embodiment of the present invention.

FIG. 8A is a flowchart illustrating an operation of the memory controller 100 in accordance with an embodiment of the present invention.

The operation illustrated in FIG. 8A may correspond to the second ECC decoding step S530 described above with reference to FIG. 5. For example, the operation illustrated in FIG. 8A may be the soft decision ECC decoding operation for the data by forming soft decision data for the soft read voltages $V_{SD}$ when the hard decision ECC decoding of the first ECC decoding step S510 finally fails.

At step S811, the memory controller 100 may read the data from the semiconductor memory device 200, for example, by the six soft read voltages $V_{SD}$ corresponding to the seven soft level sections described above with reference to FIGS. 7A to 7C. For example, the memory controller 100 may perform the additional read operation to the memory cell, to which the first ECC decoding step S510 using the hard read voltage $V_{HD}$ is performed, using the soft read voltages $V_{SD}$. The soft read voltages $V_{SD}$ may have different levels from the hard read voltage $V_{HD}$. The memory controller 100 may determine which one of the soft level sections bits of the read data belongs to by performing a plurality of soft read operations using the plurality of soft read voltages $V_{SD}$ corresponding to the soft level sections.

At step S813, the memory controller 100 may allocate the default LLR values respectively to the binary bits of the read data of step S811 by referencing a default LLR table $LLRT_{DFLT}$. The default LLR table $LLRT_{DFLT}$ may define the default LLR values, which are allocated for the soft level sections, respectively. The default LLR table $LLRT_{DFLT}$ may be stored in one of the storage unit 110 and the LLR management unit 170.

At step S815, the memory controller 100 may perform the soft decision ECC decoding operation based on the default LLR values allocated to the binary bits of the read data. The soft decision ECC decoding operation may be performed by the ECC unit 130. The soft decision ECC decoding operation may be performed based on data comprising the hard read data, to which the hard decision ECC decoding is performed, and the soft read data read from the memory cell by the soft read voltages $V_{SD}$. The hard read voltage $V_{HD}$ and the soft read voltages $V_{SD}$ may have different levels. When the additional read operation by the soft read voltages $V_{SD}$ is performed as well as the read operation by the hard read voltage $V_{HD}$, additional information on the threshold voltages of the memory cells may be obtained. When the additional information is obtained, the probability that the data of the memory cells belong to the first state, i.e., '1', or the second state, i.e., '0', that is, the likelihood ratio may increase. That is, the reliability of the ECC decoding may increase. The memory controller 100 may perform the soft decision ECC decoding operation based on the hard read data by the hard read voltage $V_{HD}$ and the soft read data by the soft read voltages $V_{SD}$.

At step S817, it may be determined whether the soft decision ECC decoding succeeds or fails. That is, at step S817, it may be determined whether an error of the soft read and decoded data, which is decoded from the soft read data through the soft decision ECC decoding at step S815, is corrected. For example, the memory controller 100 may determine whether the error of the soft read and decoded data is corrected by using the parity check matrix. For example, when product result of the parity check matrix and the soft read and decoded data is the zero vector ('0'), it may be determined that the soft read and decoded data is corrected. On the other hand, when product result of the parity check matrix and the soft read and decoded data is not the zero vector ('0'), it may be determined that the soft read and decoded data is not corrected.

When it is determined that the soft read and decoded data is corrected as the result of determination of step S817, it may be determined at step S819 that the read operation by the soft read voltage $V_{SD}$ at step S811 is successful.

When it is determined at step S819 that the soft decision ECC decoding operation at step S815 is successful, the LLR management unit 170 of the memory controller 100 may determine whether to generate or update an updated LLR table $LLRT_{UPDT}$ at step S821. The updated LLR table $LLRT_{UPDT}$ may define the updated LLR values ("Estimated New LLR") or the integer LLR values ("New LLR (3-bit int)") as described above with reference to FIG. 7B. For example, the LLR management unit 170 may determine whether to generate or update the updated LLR table $LLRT_{UPDT}$ based on one or more of the following factors: (1) a number of error-corrected bits in the read data as the successful result of the soft decision ECC decoding operation of step S815 (i.e., the number of bits which are corrected through the soft decision ECC decoding operation among error bits of read data at step S811); (2) a number of the soft read operations until the success of the soft decision ECC decoding operation of step S815; and (3) a number of the iterations of the LDPC decoding operation described above with reference to FIG. 6C. For example, when one or more of the number of the soft read operations and the number of the iterations of the LDPC decoding operation are relatively great in consideration of the number of error-corrected bits, the LLR management unit 170 may determine to generate or update the updated LLR table $LLRT_{UPDT}$. For example, when one or more of the number of the soft read operations and the number of the iterations of the LDPC decoding operation are greater than a predetermined threshold value for a predetermined number of error-corrected bits, the LLR management unit 170 may determine to generate or update the updated LLR table $LLRT_{UPDT}$.

When it is determined not to generate or update the updated LLR table $LLRT_{UPDT}$ as a result of step S821, the soft decision ECC decoding may end. The soft read and decoded data may now be the error-corrected data and may be provided externally or used in the memory controller 100.

For example, when it is determined to generate or update the updated LLR table $LLRT_{UPDT}$ as a result of step S821, the LLR management unit 170 at step S823 may update the updated LLR table $LLRT_{UPDT}$ if the updated LLR table $LLRT_{UPDT}$ is already generated, and may generate the updated LLR table $LLRT_{UPDT}$ if the updated LLR table $LLRT_{UPDT}$ is not generated yet. For another example, when it is determined to generate or update the updated LLR table $LLRT_{UPDT}$ as a result of step S821, the LLR management unit 170 at step S823 may update the updated LLR table $LLRT_{UPDT}$, which is initially stored. The updated LLR table $LLRT_{UPDT}$ may be stored in one of the storage unit 110 and the LLR management unit 170.

At step S823, the updated LLR table $LLRT_{UPDT}$ may be generated or updated according to the above-described Equation 2.

When it is determined that the soft read and decoded data is not corrected as the result of determination of step S817, the memory controller 100 may determine whether the LLR values allocated to each bit of the read data of step S811 are from the updated LLR table $LLRT_{UPDT}$ at step S825. In accordance with an embodiment of the present invention, when it is determined the soft decision ECC decoding operation using the LLR values of the default LLR table $LLRT_{DFLT}$ to fail, the soft decision ECC decoding operation may be additionally performed using the LLR values of the updated LLR table $LLRT_{UPDT}$. At step S825, the memory controller 100 may determine whether a current soft decision ECC decoding operation of step S815 is additionally performed using the LLR values of the updated LLR table $LLRT_{UPDT}$.

When it is determined at step S825 that the current soft decision ECC decoding operation of step S815 is additionally performed using the LLR values of the updated LLR table $LLRT_{UPDT}$, it may be determined at step S827 that the read operation by the soft read voltage $V_{SD}$ at step S811 finally fails and the operation of the memory controller 100 may end.

When it is determined at step S825 that the current soft decision ECC decoding operation of step S815 is performed using the LLR values of the default LLR table $LLRT_{DFLT}$, the memory controller 100 at step S829 may allocate the LLR values of the updated LLR table $LLRT_{UPDT}$, which is generated or updated at step S823, to the binary bits of the read data, and after that, the memory controller 100 may repeat steps S815 to S827 for another soft decision ECC decoding operation using the LLR values of the updated LLR table $LLRT_{UPDT}$.

Figure 8B:
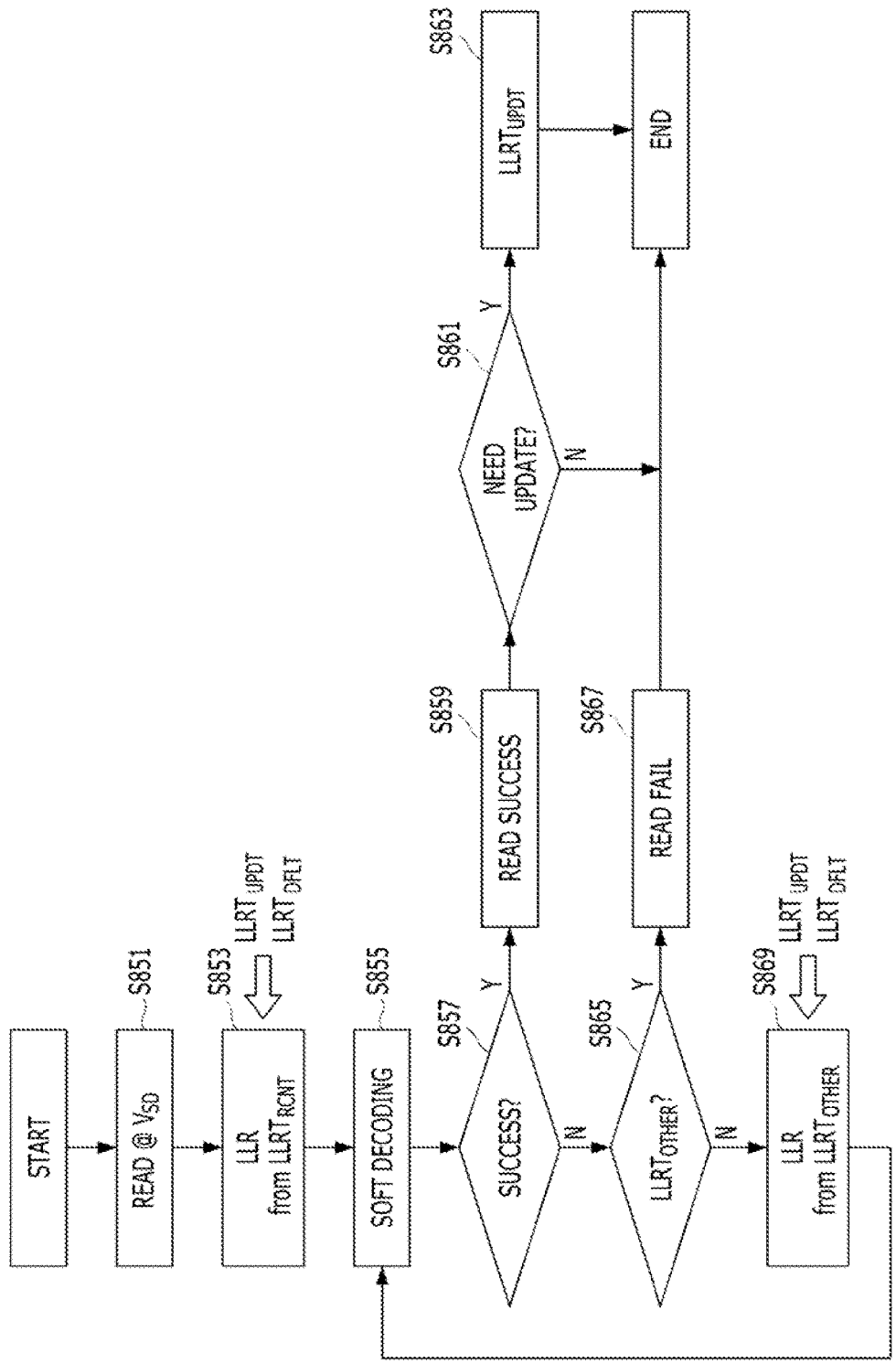
FIG. 8B is a flowchart illustrating an operation of a memory controller in accordance with an embodiment of the present invention.

FIG. 8B is a flowchart illustrating an operation of the memory controller 100 in accordance with an embodiment of the present invention.

The operation illustrated in FIG. 8B may correspond to the second ECC decoding step S530 described above with reference to FIG. 5. For example, the operation Illustrated in FIG. 8B may be the soft decision ECC decoding operation for the data by forming soft decision data for the soft read voltages $V_{SD}$ when the hard decision ECC decoding of the first ECC decoding step S510 finally fails.

In accordance with the embodiment of the present invention described above with reference to FIG. 8A, the soft decision ECC decoding operation may be performed first using the LLR values of the default LLR table $LLRT_{DFLT}$ allocated to the binary bits of the read data. When it is determined the soft decision ECC decoding operation using the LLR values of the default LLR table $LLRT_{DFLT}$ to fail, additional soft decision ECC decoding operation may be performed using the LLR values of the updated LLR table $LLRT_{UPDT}$ allocated to the binary bits of the read data.

As described above, the default LLR table $LLRT_{DFLT}$ may define the default LLR values respectively assigned for the soft level sections, and the updated LLR table $LLRT_{UPDT}$ may define the updated LLR values respectively updated for the soft level sections.

In accordance with the embodiment of the present invention described with reference to FIG. 8B, the soft decision ECC decoding operation may be performed first using the LLR values of a first LLR table $LLRT_{RCNT}$ allocated to the binary bits of the read data. The first LLR table $LLRT_{RCNT}$ may be one of the default LLR table $LLRT_{DFLT}$ and the updated LLR table $LLRT_{UPDT}$, which is used for the recently successful soft decision ECC decoding operation.

When the soft decision ECC decoding operation using the first LLR table $LLRT_{RCNT}$ is determined to fail, the soft decision ECC decoding operation may be performed using the LLR values of a second LLR table $LLRT_{OTHER}$ allocated to the binary bits of the read data. The second LLR table $LLRT_{OTHER}$ may be the other one of the default LLR table $LLRT_{DFLT}$ and the updated LLR table $LLRT_{UPDT}$, which is other than the first LLR table $LLRT_{RCNT}$.

For example, the memory cells located substantially adjacent to each other in the memory block 211 of the semiconductor memory device 200 may have substantially similar threshold voltage distributions due to similar deterioration characteristics. Therefore, when the LLR values, which are allocated to a data unit of the current and successful soft decision ECC decoding operation, are allocated again to another data unit for the next soft decision ECC decoding operation, success possibility of the next soft decision ECC decoding operation may be raised. On the other hand, the memory cells located substantially far from each other in the memory block 211 of the semiconductor memory device 200 may have substantially different threshold voltage distributions due to different deterioration characteristics. Therefore, even after the current soft decision ECC decoding operation to a data unit is successful, success possibility of the next soft decision ECC decoding operation to another data unit, which is located far from the data unit, may be higher using the default LLR values of the default LLR table $LLRT_{DFLT}$ than the updated LLR values of the updated LLR table $LLRT_{UPDT}$.

Therefore, the soft decision ECC decoding operation using the LLR values of the second LLR table $LLRT_{OTHER}$ other than the first LLR table $LLRT_{RCNT}$ may also be successful. When the soft decision ECC decoding operation using the first LLR table $LLRT_{RCNT}$ is determined to fall, the soft decision ECC decoding operation may be performed using the LLR values of the second LLR table $LLRT_{OTHER}$.

At step S851, the memory controller 100 may read the data from the semiconductor memory device 200, for example, by the six soft read voltages $V_{SD}$ corresponding to the seven soft level sections described above with reference to FIGS. 7A to 7C. For example, the memory controller 100 may perform the additional read operation to the memory cell, to which the first ECC decoding step S510 using the hard read voltage $V_{HD}$ is performed, using the soft read voltages $V_{SD}$. The soft read voltages $V_{SD}$ may have different levels from the hard read voltage $V_{HD}$. The memory controller 100 may determine which one of the soft level sections bits of the read data belongs to by performing a plurality of soft read operations using the plurality of soft read voltages $V_{SD}$ corresponding to the soft level sections.

At step S853, the memory controller 100 may allocate the LLR values respectively to the binary bits of the read data of step S851 by referencing the first LLR table $LLRT_{RCNT}$. Initially, the default LLR table $LLRT_{DFLT}$ may be the first LLR table $LLRT_{RCNT}$, and the updated LLR table $LLRT_{UPDT}$ may be the second LLR table $LLRT_{OTHER}$. The first LLR table $LLRT_{RCNT}$ and the second LLR table $LLRT_{OTHER}$ may be stored in one of the storage unit 110 and the LLR management unit 170.

At step S855, the memory controller 100 may perform the soft decision ECC decoding operation based on the LLR values of the first LLR table $LLRT_{RCNT}$ allocated to the binary bits of the read data. The soft decision ECC decoding operation may be performed by the ECC unit 130. The soft decision ECC decoding operation may be performed based on data comprising the hard read data, to which the hard decision ECC decoding is performed, and the soft read data read from the memory cell by the six soft read voltages $V_{SD}$. The hard read voltage $V_{HD}$ and the soft read voltages $V_{SD}$ may have different levels. When the additional read operation by the soft read voltages $V_{SD}$ is performed as well as the read operation by the hard read voltage $V_{HD}$, additional information on the threshold voltages of the memory cells may be obtained. When the additional information is obtained, the probability that the data of the memory cells belong to the first state, i.e., '1', or the second state, i.e., '0', that is, the likelihood ratio may increase. That is, the reliability of the ECC decoding may increase. The memory controller 100 may perform the soft decision ECC decoding operation based on the hard read data by the hard read voltage $V_{HD}$ and the soft read data by the soft read voltages $V_{SD}$.

At step S857, it may be determined whether the soft decision ECC decoding succeeds or fails. That is, at step S857, it may be determined whether an error of the soft read and decoded data, which is decoded from the soft read data through the soft decision ECC decoding at step S855, is corrected. For example, the memory controller 100 may determine whether the error of the soft read and decoded data is corrected by using the parity check matrix. For example, when the product result of the parity check matrix and the soft read and decoded data is the zero vector ('0'), it may be determined that the soft read and decoded data is corrected. On the other hand, when product result of the parity check matrix and the soft read and decoded data is not the zero vector ('0'), it may be determined that the soft read and decoded data is not corrected.

When it is determined that the soft read and decoded data is corrected as the result of determination of step S857, it may be determined at step S859 that the read operation by the soft read voltage $V_{SD}$ at step S851 is successful.

When it is determined at step S859 that the soft decision ECC decoding operation at step S855 is successful, the LLR management unit 170 of the memory controller 100 may determine whether to update an updated LLR table $LLRT_{UPDT}$ at step S861. For example, the LLR management unit 170 may determine whether to update the updated LLR table $LLRT_{UPDT}$ based on one or more of the following factors: (1) a number of error-corrected bits in the read data as the successful result of the soft decision ECC decoding operation of step S855 (i.e., the number of bits which are corrected through the soft decision ECC decoding operation among error bits of read data at step S851); (2) a number of the soft read operations until the success of the soft decision ECC decoding operation of step S855; and (3) a number of the iterations of the LDPC decoding operation described above with reference to FIG. 6C. For example, when one or more of the number of the soft read operations and the number of the iterations of the LDPC decoding operation are relatively great in consideration of the number of error-corrected bits, the LLR management unit 170 may determine to update the updated LLR table $LLRT_{UPDT}$.

When it is determined not to update the updated LLR table $LLRT_{UPDT}$ as a result of step S861, the soft decision ECC decoding may end. The soft read and decoded data may now be the error-corrected data and may be provided externally or used in the memory controller 100.

For example, when it is determined to update the updated LLR table $LLRT_{UPDT}$ as a result of step S861, the LLR management unit 170 at step S863 may update the updated LLR table $LLRT_{UPDT}$.

At step S863, the updated LLR table $LLRT_{UPDT}$ may be updated according to the above-described Equation 2.

When it is determined that the soft read and decoded data is not corrected as the result of determination of step S857, the memory controller 100 may determine whether the LLR values allocated to each bit of the read data of step S851 are from the second LLR table $LLRT_{OTHER}$ at step S865. In accordance with an embodiment of the present invention, when it is determined the soft decision ECC decoding operation using the LLR values of the first LLR table $LLRT_{RCNT}$ to fail, the soft decision ECC decoding operation may be additionally performed using to the LLR values of the second LLR table $LLRT_{OTHER}$. At step S865, the memory controller 100 may determine whether a current soft decision ECC decoding operation of step S855 is additionally performed using the LLR values of the second LLR table $LLRT_{OTHER}$.

When it is determined at step S865 that the current soft decision ECC decoding operation of step S855 is additionally performed using the LLR values of the second LLR table $LLRT_{OTHER}$, it may be determined at step S867 that the read operation by the soft read voltage $V_{SD}$ at step S851 finally falls and the operation of the memory controller 100 may end.

When it is determined at step S865 that the current soft decision ECC decoding operation of step S855 is performed using the LLR values of the first LLR table $LLRT_{RCNT}$, the memory controller 100 at step S869 may allocate the LLR values of the second LLR table $LLRT_{OTHER}$ to the binary bits of the read data, and after that, the memory controller 100 may repeat steps S855 to S867 for another soft decision ECC decoding operation using the LLR values of the second LLR table $LLRT_{OTHER}$.

Figure 9:
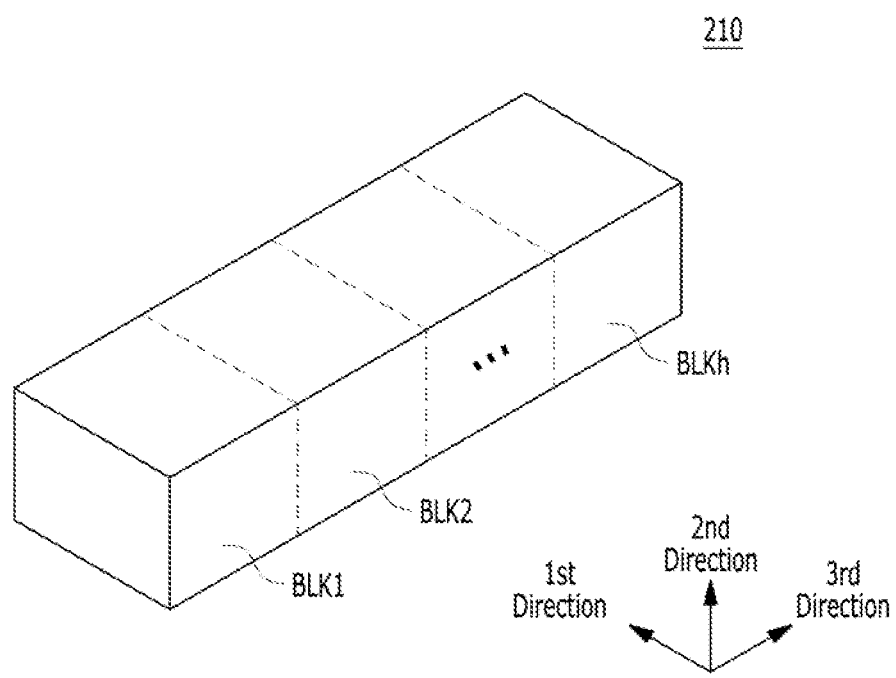
FIGS. 9 to 13 are diagrams schematically illustrating a three-dimensional (3D) nonvolatile memory device in accordance with an embodiment of the present invention.

FIG. 9 is a block diagram of the memory cell array 210 shown in FIG. 4A.

Referring to FIG. 9, the memory cell array 210 may include a plurality of memory blocks BLK1 to BLKh. Each of the memory blocks BLK1 to BLKh may have a 3D structure or a vertical structure. For example, each of the plural memory blocks BLK1 to BLKh may include a structure extending along first to third directions.

Each of the plural memory blocks BLK1 to BLKh may include a plurality of NAND strings NS extending along the second direction. A plurality of NAND strings NS may be provided along the first and third directions. Each of the NAND strings NS may be coupled to a bit line BL, one or more string select lines SSL, one or more ground select lines GSL, a plurality of word lines WL, one or more dummy word lines DWL, and a common source line CSL. That is, each of the plural memory blocks BLK1 to BLKh may be coupled to a plurality of bit lines BL, a plurality of string select lines SSL, a plurality of ground select lines GSL, a plurality of word lines WL, a plurality of dummy word lines DWL, and a plurality of common source lines CSL.

Figure 10:
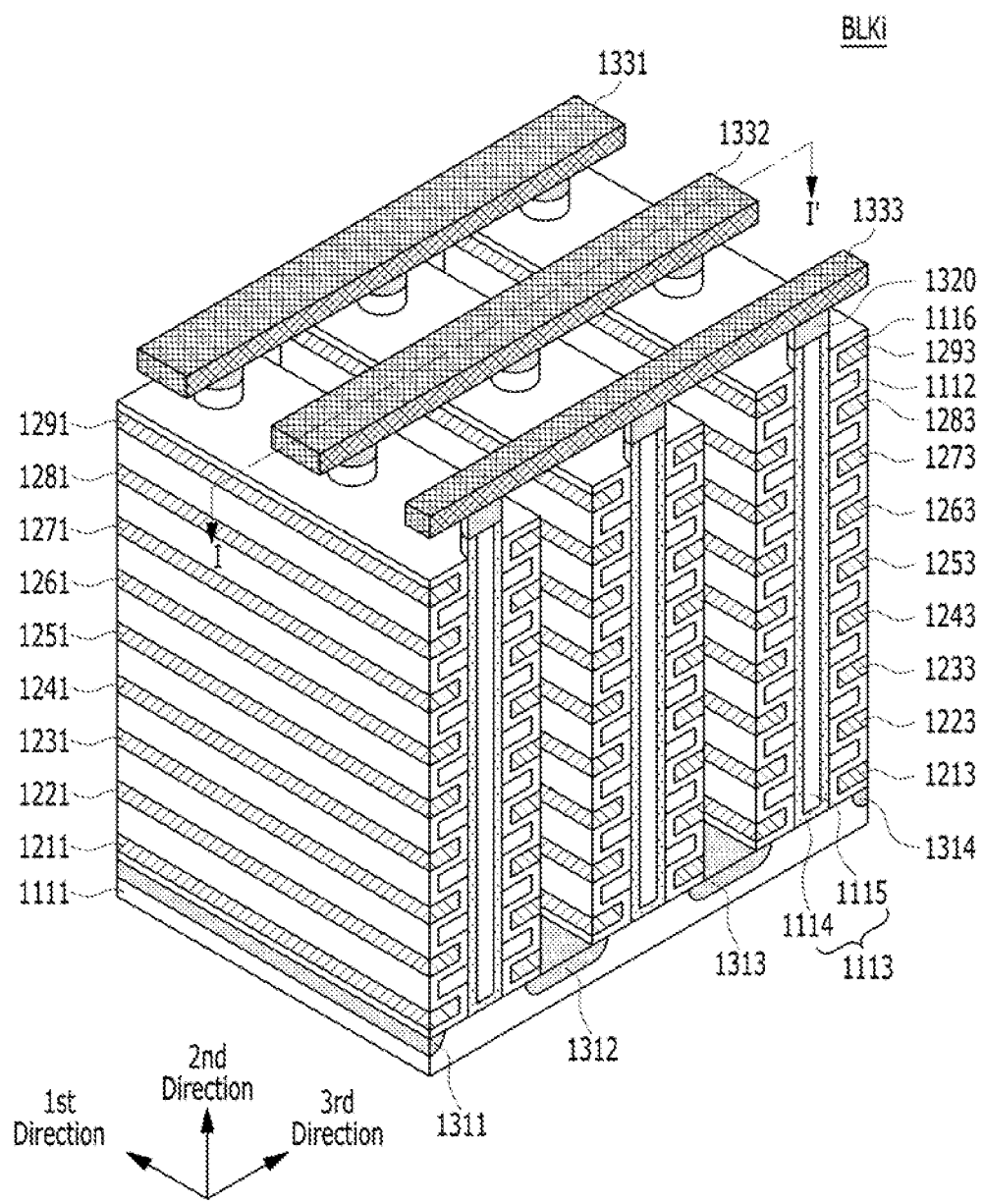
Figure 11:
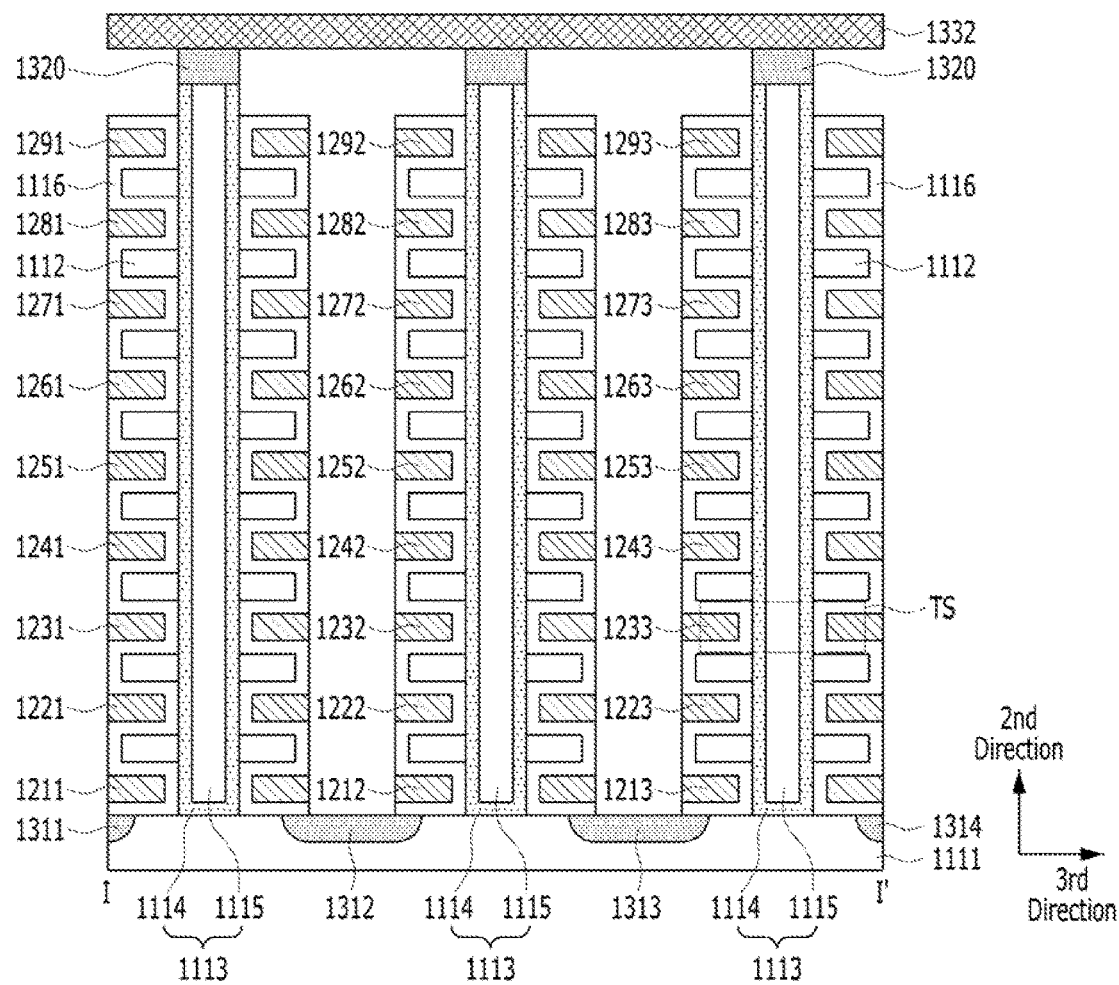

FIG. 10 is a perspective view of one memory block BLKi of the plural memory blocks BLK1 to BLKh shown in FIG. 9. FIG. 11 is a cross-sectional view taken along a line I-I' of the memory block BLKi shown in FIG. 10.

Referring to FIGS. 10 and 11, the memory block BLKi may include a structure extending along first to third directions.

A substrate 1111 may be provided. For example, the substrate 1111 may include a silicon material doped by a first type impurity. For example, the substrate 1111 may include a silicon material doped by a p-type impurity or a p-type well, e.g., a pocket p-well. The substrate 1111 may further include an n-type well surrounding the p-type well. It is exemplarily described that the substrate 1111 is p-type silicon. However, the substrate 1111 is not limited to being p-type silicon.

A plurality of doping regions 1311 to 1314 extending along the first direction may be provided over the substrate 1111. For example, the plurality of doping regions 1311 to 1314 may have a second type impurity differing from that of the substrate 1111. For example, the plurality of doping regions 1311 to 1314 may be doped with an n-type impurity. In the description, it is exemplarily described that the first to fourth doping regions 1311 to 1314 are of n-type. However, the first to fourth doping regions 1311 to 1314 are limited to being n-type.

A plurality of insulation materials 1112 extending along the first direction may be sequentially provided along the second direction over a region of the substrate 1111 between the first and second doping regions 1311 and 1312. For example, the plurality of insulation materials 1112 and the substrate 1111 may be spaced apart by a predetermined distance in the second direction. In a second example, the plurality of insulation materials 1112 may be spaced apart from each other in the second direction. In a third example, the insulation materials 1112 may include an insulator such as silicon oxide.

A plurality of pillars 1113 may be sequentially provided along the first direction over a region of the substrate 111 between the first doping region 1311 and the second doping region 1312, and may be formed to penetrate the insulation materials 1112 along the second direction. For example, each of the plurality of pillars 1113 may penetrate the insulation materials 1112 to be in contact with the substrate 1111. Each of the plural pillars 1113 may be composed of a plurality of materials. A surface layer 1114 of each of the plural pillars 1113 may include a silicon material having a first type. The surface layer 1114 of each of the plural pillars 1113 may include a silicon material doped with the same type impurity as that of the substrate 1111. In the description, it is exemplarily described that the surface layer 1114 of each of the pillars 1113 includes p-type silicon. However, the surface layer 1114 of each of plural pillars 1113 is not limited to p-type silicon.

An inner layer 1115 of each of the plural pillars 1113 may be formed of an insulation material. For example, the inner layer 1115 of each of the plural pillars 1113 may be filled with an insulation material such as silicon oxide.

In a region between the first and second doping regions 1311 and 1312, an insulation layer 1116 may be provided along exposed surfaces of the insulation materials 1112, the pillars 1113, and the substrate 1111. For example, the thickness of the insulation layer 1116 may be smaller than half of the distance between the insulation materials 1112. That is, a region for a material other than the insulation materials 1112 and the insulation layer 1116 to be disposed may be provided between (i) the insulation layer 1116 provided over the bottom surface of a first insulation material of the insulation materials 1112 and (ii) the insulation layer 1116 provided over the top surface of a second insulation material of the insulation materials 1112. The first insulation material of the insulation materials 1112 may be disposed over the second insulation material of the insulation materials 1112.

In the region between the first and second doping regions 1311 and 1312, conductive materials 1211 to 1291 may be provided over the surface of the insulation layer 1116. For example, the conductive material 1211 extending along the first direction may be provided between the substrate 1111 and the plural insulation materials 1112 adjacent to the substrate 1111. More specifically, the conductive material 1211 extending along the first direction may be provided between (i) the insulation layer 1116 disposed at the bottom surface of the insulation materials 1112 adjacent to the substrate 1111 and (ii) the insulation layer 1116 disposed over the substrate 1111.

For another example, the conductive materials 1221 to 1281 extending along the first direction may be provided between (i) the insulation layer 1116 disposed at the top surface of a first specific insulation material among the insulation materials 1112 and (ii) the Insulation layer 1116 disposed at the bottom surface of a second specific insulation material among the insulation materials 1112, which is disposed over the first specific insulation material 1112. Also, the conductive material 1291 extending along the first direction may be provided over the uppermost insulation materials 1112. For example, the conductive materials 1211 to 1291 may be a metallic material. In another example, the conductive materials 1211 to 1291 may be polysilicon.

The same structure as the structure disposed between the first and second doping regions 1311 and 1312 may be provided between the second and third doping regions 1312 and 1313. For example, the plurality of insulation materials 1112 extending along the first direction, the plurality of pillars 1113 which are sequentially arranged in the first direction and penetrate the plurality of insulation materials 1112 along the second direction, the insulation layer 1116 provided over the surfaces of the plurality of insulation materials 1112 and the plurality of pillars 1113, and the plurality of conductive materials 1212 to 1292 extending along the first direction may be provided between the second and third doping regions 1312 and 1313.

The same structure as disposed between the first and second doping regions 1311 and 1312 may be provided between the third and fourth doping regions 1313 and 1314. For example, the plurality of insulation materials 1112 extending along the first direction, the plurality of pillars 1113 which are sequentially arranged in the first direction and penetrate the plurality of insulation materials 1112 along the second direction, the insulation layer 1116 provided over the surfaces of the plurality of insulation materials 1112 and the plurality of pillars 1113, and the plurality of conductive materials 1213 to 1293 extending along the first direction may be provided between the third and fourth doping regions 1313 and 1314.

Drains 1320 may be provided over the plurality of pillars 1113, respectively. For example, the drains 1320 may be a silicon material doped with a second type material. For example, the drains 1320 may be a silicon material doped with an n-type material. In the description, it is exemplarily described that the drains 320 are a silicon material doped with an n-type material. However, the drains 320 are not limited to being n-type silicon materials. For example, the width of the drains 1320 may be wider than that of a corresponding one of the plural pillars 1113. For example, the drains 1320 may be provided over a top surface of the corresponding one of the plural pillars 1113, in a pad shape.

Conductive materials 1331 to 1333 extending in the third direction may be provided over the drains 1320. The conductive materials 1331 to 1333 may be sequentially disposed along the first direction. The conductive materials 1331 to 1333 may be respectively coupled to the drains 1320 in the corresponding region. For example, the drains 1320 and the conductive material 1333 extending along the third direction may be coupled to each other through contact plugs, respectively. For example, the conductive materials 1331 to 1333 may be a metallic material. In another example, the conductive materials 1331 to 1333 may be polysilicon.

Referring to FIGS. 10 and 11, each of the plural pillars 1113 may be coupled to the insulation layer 1116 and the plurality of conductive materials 1211 to 1291, 1212 to 1292, or 1213 to 1293 extending along the first direction, to form a string. For example, each of the plural pillars 1113 may form a NAND string NS together with the insulation layer 1116 and the conductive materials 1211 to 1291, 1212 to 1292, or 1213 to 1293 extending along the first direction. The NAND string NS may include a plurality of transistor structures TS.

Figure 12:
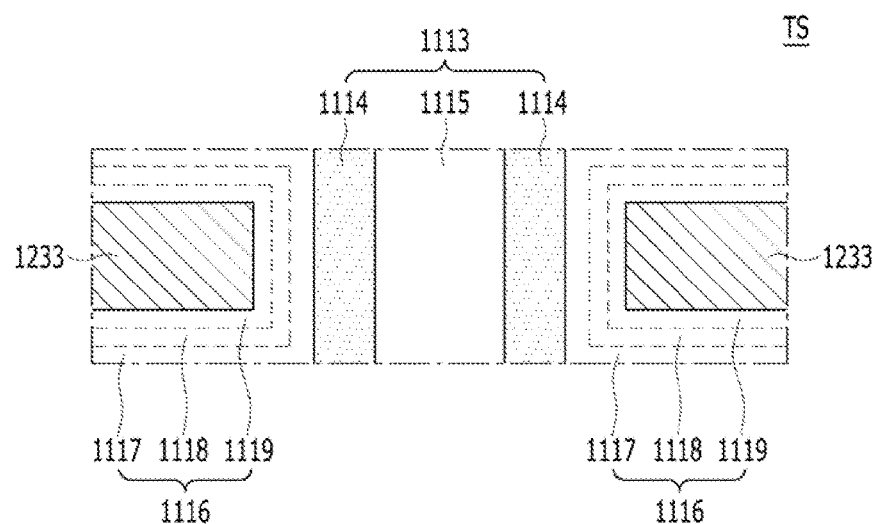

FIG. 12 is a cross-sectional view of the transistor structure TS shown in FIG. 11.

Referring to FIGS. 10 to 12, the insulation layer 1116 may include first to third sub insulation layers 1117, 1118 and 1119.

The surface layer 1114 of P-type silicon in each of the plural pillars 1113 may serve as a body. The first sub insulation layer 1117, adjacent to each of the plural pillars 1113, may serve as a tunneling insulation layer. For example, the first sub insulation layer 1117, adjacent to the each of the plural pillars 1113, may include a thermal oxide layer.

The second sub insulation layer 1118 may serve as a charge storage layer. For example, the second sub insulation layer 1118 may serve as a charge trap layer. The second sub insulation layer 1118 may include a nitride layer or a metal oxide layer, e.g., aluminium oxide layer, hafnium oxide layer, etc.

The third sub insulation layer 1119, adjacent to a conductive material 1233, may serve as a blocking insulation layer. For example, the third sub insulation layer 1119, adjacent to the conductive material 1233 extending along the first direction, may have a mono-layered or multi-layered structure. The third sub insulation layer 1119 may be a high-k dielectric layer, e.g., aluminium oxide layer, hafnium oxide layer, etc., having a dielectric constant greater than the first and second sub insulation layers 1117 and 1118.

The conductive material 1233 may serve as a gate or control gate. That is, the gate or control gate 1233, the blocking insulation layer 1119, the charge trap layer 1118, the tunneling insulation layer 1117, and the body 1114 may form a transistor or memory cell transistor structure. For example, the first to third sub insulation layers 1117 to 1119 may form an oxide-nitride-oxide (ONO) structure. In the description, the surface layer 1114 of p-type silicon in each of the plural pillars 1113 may be a body extending in the second direction.

The memory block BLKi may include the plurality of pillars 1113. That is, the memory block BLKi may include the plurality of NAND strings NS. More specifically, the memory block BLKi may include the plurality of NAND strings NS extending along the second direction or a direction perpendicular to the substrate 1111.

Each of the NAND strings NS may include the plurality of transistor structures TS, which are stacked in the second direction. One or more of the plurality of transistor structures TS of each NAND string NS may serve as a string select transistor SST. One or more of the plurality of transistor structures TS of each NAND string may serve as a ground select transistor GST.

The gates or control gates may correspond to the conductive materials 1211 to 1291, 1212 to 1292, and 1213 to 1293 extending along the first direction. That is, the gates or control gates may extend along the first direction to form word lines WL and two or more select lines, e.g., one or more string select line SSL and one or more ground select line GSL.

The conductive materials 1331 to 1333 extending along the third direction may be coupled to one end of the NAND strings NS. For example, the conductive materials 1331 to 1333 extending along the third direction may serve as bit lines BL. That is, in one memory block BLKi, a single bit line BL may be coupled to the plurality of NAND strings NS.

The second type doping regions 1311 to 1314 extending along the first direction may be coupled to the other end of the NAND strings NS. The second type doping regions 1311 to 1314 extending along the first direction may serve as common source lines CSL.

In summary, the memory block BLKi may include the plurality of NAND strings NS extending along a direction, e.g., a second direction, perpendicular to the substrate 1111, and may operate as a NAND flash memory block, for example, a charge trap type memory, in which the plurality of NAND strings NS is coupled to a single bit line BL.

With reference to FIGS. 10 to 12, it is described that the conductive materials 1211 to 1291, 1212 to 1292, and 1213 to 1293 extending along the first direction are provided on 9 layers. However, the conductive materials 1211 to 1291, 1212 to 1292, and 1213 to 1293 extending along the first direction are not limited to 9 layers. For example, the conductive materials extending along the first direction may be provided upon 8, 16, or more layers. That is, a NAND string may include 8, 16, or more transistors.

With reference to FIGS. 10 to 12, it is described that 3 NAND strings NS are coupled to a single bit line BL. However, the embodiment is not limited to 3 NAND strings NS coupled to a single bit line BL. In another embodiment, in the memory block BLKi, m NAND strings NS may be coupled to a single bit line BL, m being a positive integer. Here, the number of the conductive materials 1211 to 1291, 1212 to 1292, and 1213 to 1293 extending along the first direction and the number of common source lines 1311 to 1314 may also be adjusted to correspond to the number of NAND strings NS coupled to a single bit line BL.

With reference to FIGS. 10 to 12, it is described that 3 NAND strings NS are coupled to a single conductive material extending along the first direction. However, the embodiment is not limited to 3 NAND strings NS coupled to a single conductive material. In another embodiment, n NAND strings NS may be coupled to a single conductive material, n being a positive integer. Here, the number of the bit lines 1331 to 1333 may also be adjusted to correspond to the number of NAND strings NS coupled to a single conductive material.

Figure 13:
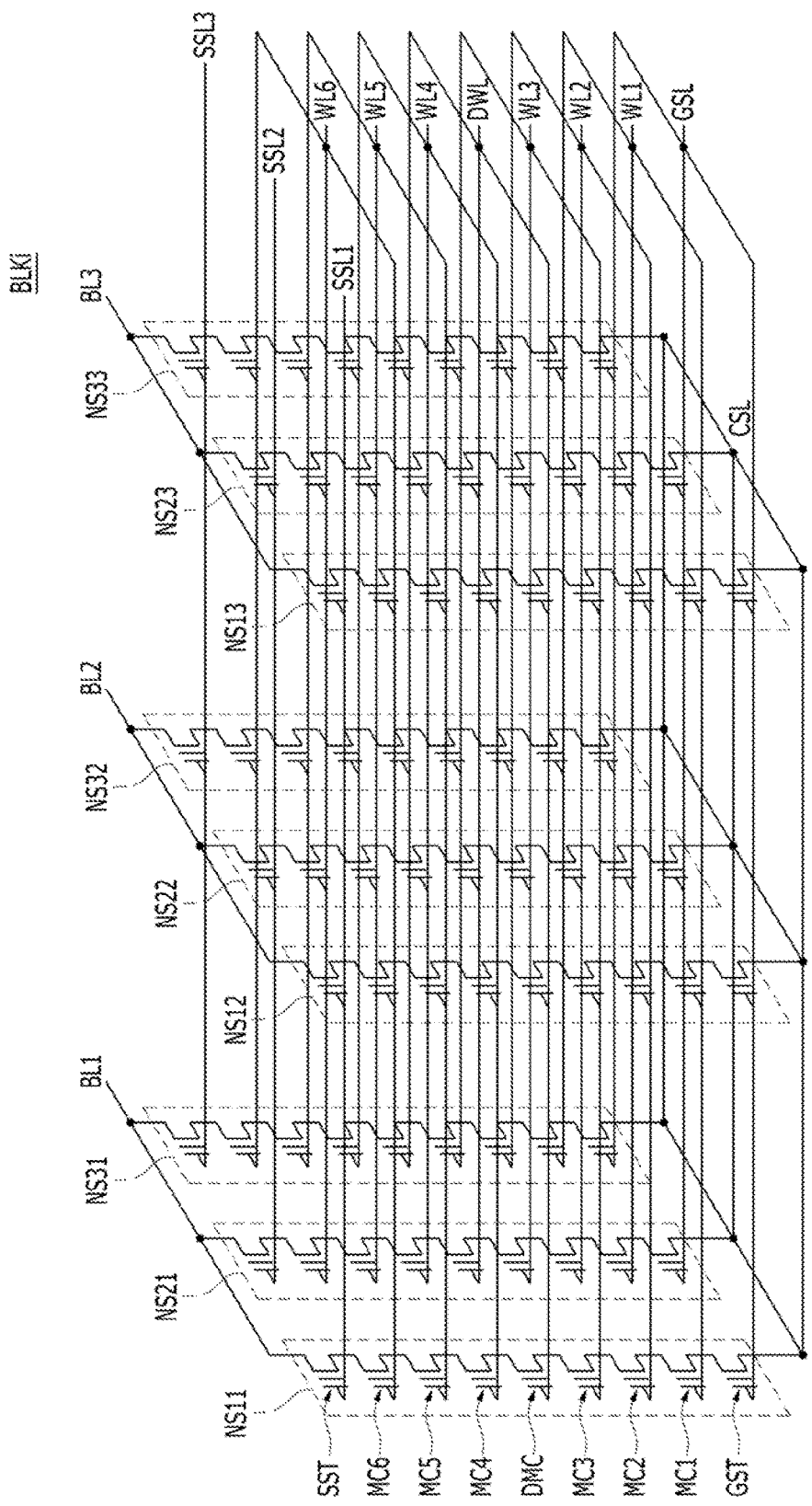

FIG. 13 is an equivalent circuit diagram illustrating the memory block BLKi described with reference to FIGS. 10 to 12.

Referring to FIGS. 10 to 13, NAND strings NS11 to NS31 may be provided between a first bit line BL1 and a common source line CSL. The first bit line BL1 may correspond to the conductive material 1331 extending along the third direction. NAND strings NS12 to NS32 may be provided between a second bit line BL2 and the common source line CSL. The second bit line BL2 may correspond to the conductive material 1332 extending along the third direction. NAND strings NS13 to NS33 may be provided between a third bit line BL3 and the common source line CSL. The third bit line BL3 may correspond to the conductive material 1333 extending along the third direction.

A string select transistor SST of each NAND string NS may be coupled to a corresponding bit line BL. A ground select transistor GST of each NAND string NS may be coupled to the common source line CSL. Memory cells MC may be provided between the string select transistor SST and the ground select transistor GST of each NAND string NS.

The NAND strings NS may be defined in units of rows and columns. The NAND strings NS commonly coupled to a single bit line may form a single column. For example, the NAND strings NS11 to NS31 coupled to the first bit line BL1 may correspond to a first column. The NAND strings NS12 to NS32 coupled to the second bit line BL2 may correspond to a second column. The NAND strings NS13 to NS33 coupled to the third bit line BL3 may correspond to a third column.

The NAND strings NS coupled to a single string select line SSL may form a single row. For example, the NAND strings NS11 to NS13 coupled to a first string select line SSL1 may form a first row. The NAND strings NS21 to NS23 coupled to a second string select line SSL2 may form a second row. The NAND strings NS31 to NS33 coupled to a third string select line SSL3 may form a third row.

A height may be defined for a transistor or a memory cell in each NAND string NS. For example, the height of the ground select transistor GST may be defined as a value '1' in each NAND string NS. In each NAND string NS, the closer to the string selection transistor SST, the higher the height of the memory cell with reference to the substrate 1111, when measured from the substrate 1111. In each NAND string NS, the height of the memory cell MC6 adjacent to the string select transistor SST may be defined as a value '8', which is 8 times greater than the ground select transistor GST.

The string select transistors SST of the NAND strings NS of the same row may share the same string select line SSL. The string select transistors SST of the NAND strings NS in different rows may be coupled with different string select lines SSL1, SSL2, and SSL3, respectively.

The memory cells MC having the same height in the NAND strings NS of the same row may share a word line WL. At the same height, word lines WL coupled to the respective memory cells MC of the NAND strings NS in different rows may be coupled to one another and shared by the memory cells MC. At a predetermined height or at the same level, dummy memory cells DMC of the NAND strings NS of the same row may share a dummy word line DWL. Dummy word lines DWL coupled to the respective dummy memory cells DMC of the NAND strings NS in different rows may be coupled to one another and shared by the dummy memory cells DMC.

For example, the word lines WL or the dummy word lines DWL located at the same level or height or layer may be coupled on layers where the conductive materials 1211 to 1291, 1212 to 1292, and 1213 to 1293 extending in the first direction are provided. For example, the conductive materials 1211 to 1291, 1212 to 1292, and 1213 to 1293 provided at a given level or height or layer may be coupled to an upper layer via a contact. The conductive materials 1211 to 1291, 1212 to 1292, and 1213 to 1293 extending in the first direction may be coupled at the upper layer. The ground select transistors GST of the NAND strings NS of the same row may share a ground select line GSL. Ground select lines GSL coupled to the respective ground select transistors GST of the NAND strings NS in different rows may be coupled to one another and shared by the ground select transistors GST. That is, the NAND strings NS11 to NS13, NS21 to NS23, and NS31 to NS33 may be coupled to the ground select lines GSL.

The common source line CSL may be commonly coupled to the NAND strings NS. For example, the first to fourth doping regions 1311 to 1314 may be coupled at an active region of the substrate 1111. For example, the first to fourth doping regions 1311 to 1314 may be coupled to an upper layer via a contact. The first to fourth doping regions 1311 to 1314 may be coupled at the upper layer.

As illustrated in FIG. 13, the word lines WL at the same height or level may be commonly coupled. Therefore, when a word line WL at a specific height is selected, all of the NAND strings NS coupled to the selected word line WL may be selected. The NAND strings NS in different rows may be coupled to different string select lines SSL. Accordingly, among the NAND strings NS coupled to the same word line WL, the NAND strings NS of the unselected row may be electrically isolated from the bit lines BL1 to BL3 by selection of the string selection lines SSL1 to SSL3. That is, a row of the NAND strings NS may be selected by selecting one of the string select lines SSL1 to SSL3. The NAND strings NS of the selected row may be selected in units of columns by selection of the bit lines BL1 to BL3.

In each NAND string NS, a dummy memory cell DMC may be provided. FIG. 13 shows the dummy memory cell DMC provided between the third memory cell MC3 and the fourth memory cell MC4 in each NAND string NS. That is, the first to third memory cells MC1 to MC3 may be provided between the dummy memory cell DMC and the ground select transistor GST. The fourth to sixth memory cells MC4 to MC6 may be provided between the dummy memory cell DMC and the string select transistor SST. It is exemplarily described that the memory cells MC in each NAND string NS are divided into memory cell groups by the dummy memory cell DMC. A memory cell group, e.g., MC1 to MC3, that is adjacent to the ground select transistor GST among the memory cell groups may be referred to as a lower memory cell group. A memory cell group, e.g., MC4 to MC6, adjacent to the string select transistor SST among the memory cell groups may be referred to as an upper memory cell group.

An operating method of a nonvolatile memory device which includes one or more cell strings each arranged in a direction perpendicular to a substrate coupled with a memory controller and including memory cells, a string select transistor, and a ground select transistor will be described with reference to FIGS. 9 to 13. With the operating method, the nonvolatile memory device: may be provided with a first read command to perform first and second hard decision read operations using a first hard read voltage and a second hard read voltage, which is different from the first hard read voltage; may acquire hard decision data; may select one of the first and second hard decision voltages based on an error bit state of the hard decision data; may acquire soft decision data using a soft read voltage, which is different from a selected hard decision read voltage; and may provide the soft decision data to a memory controller.

Figure 14:
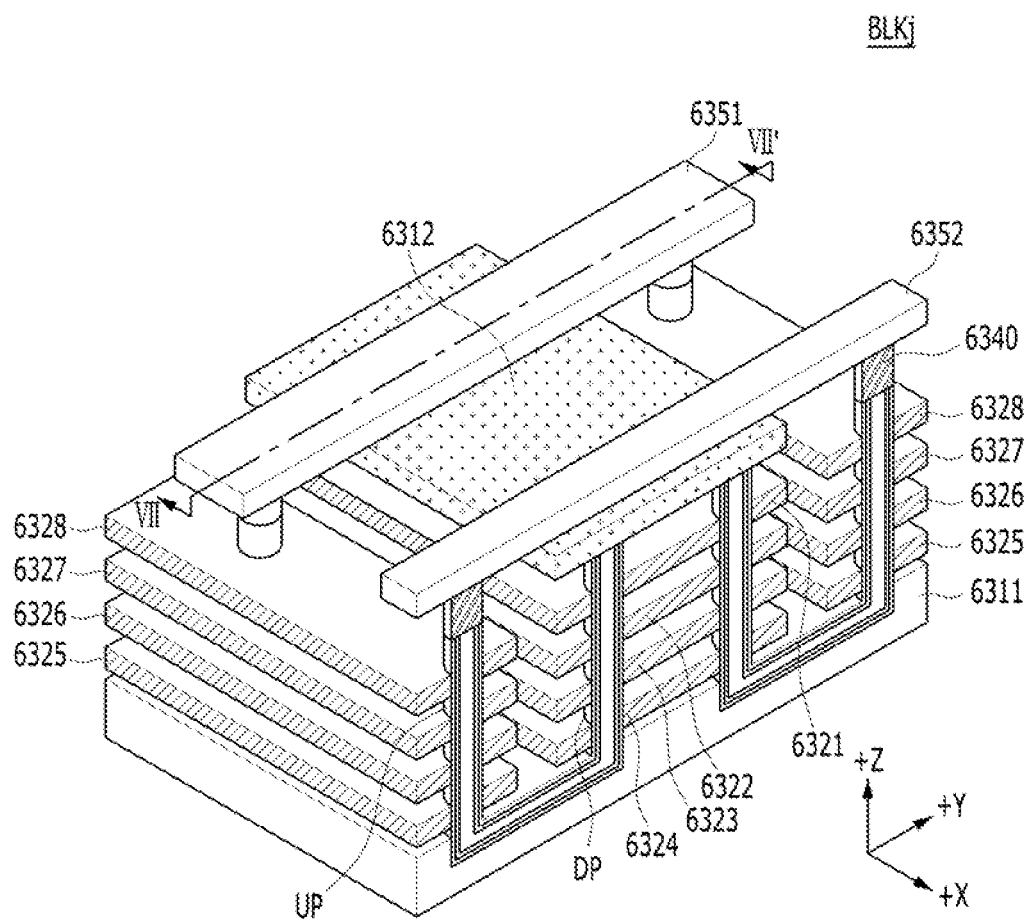
FIGS. 14 to 16 are diagrams schematically illustrating a 3D nonvolatile memory device in accordance with an embodiment of the present invention.
Figure 15:
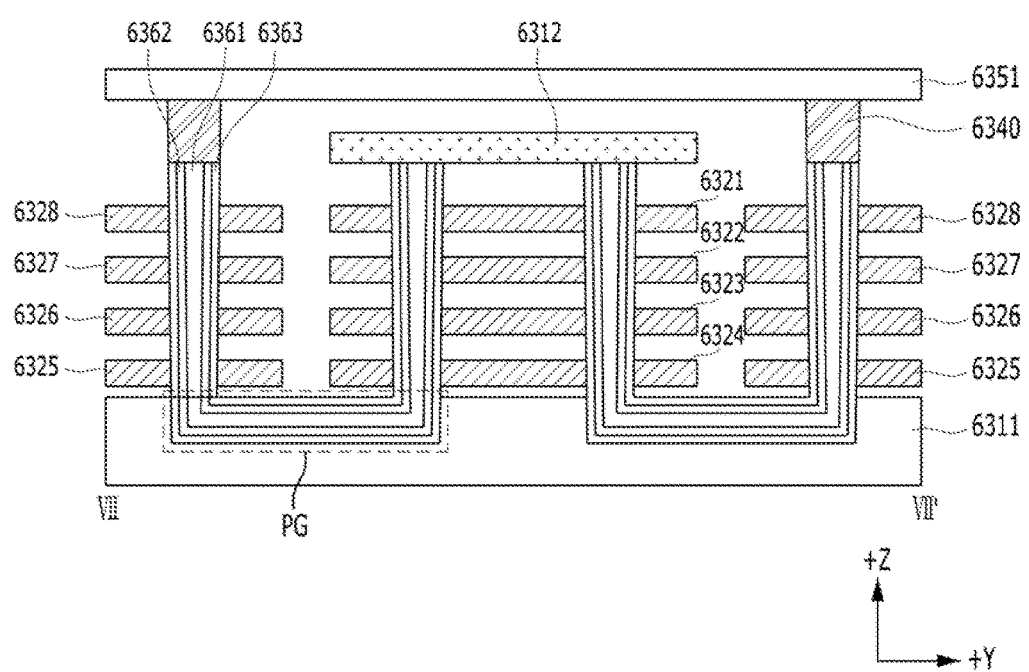
Figure 16:
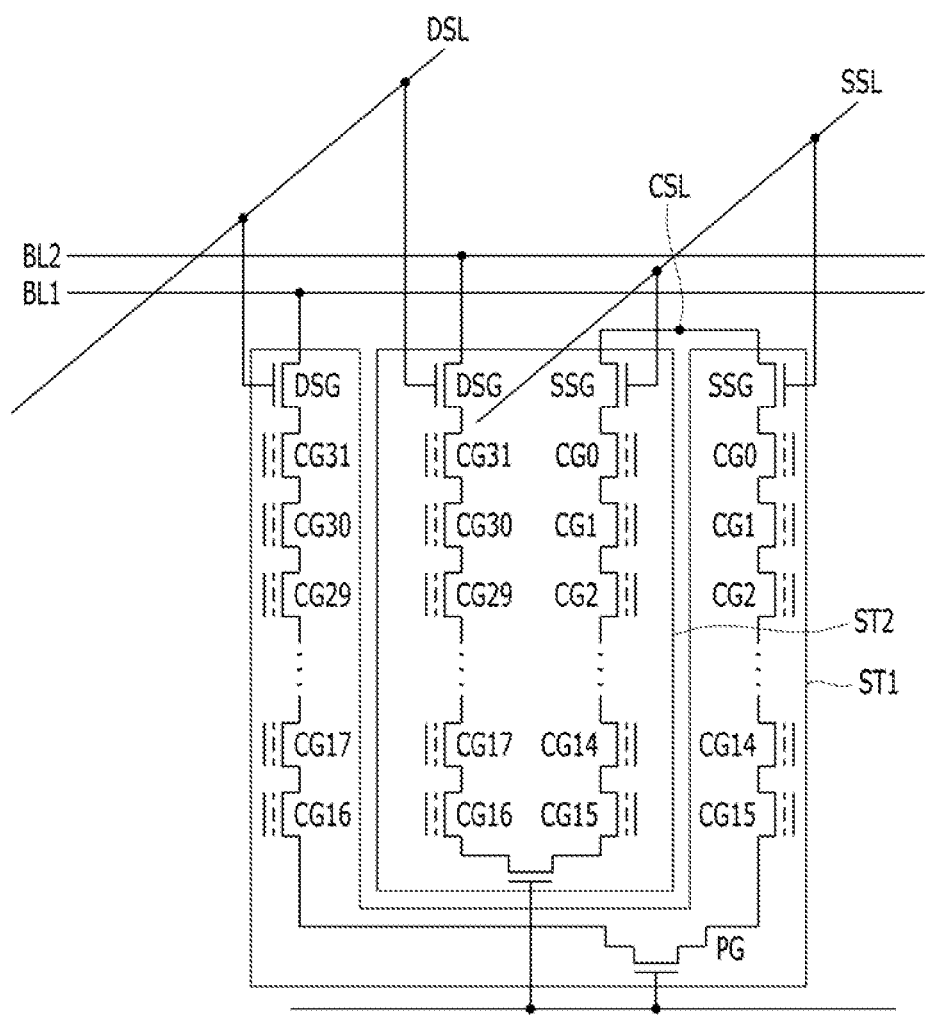

FIGS. 14 to 16 are diagrams schematically illustrating a 3D nonvolatile memory device in accordance with an embodiment of the present invention. FIGS. 14 to 16 illustrate the semiconductor memory device, for example a flash memory device implemented in 3D in accordance with an embodiment of the present invention.

FIG. 14 is a perspective view illustrating one memory block BLKj of the memory blocks 211 shown in FIG. 4A. FIG. 15 is a cross-sectional view illustrating the memory block BLKj taken along the line VII-VII' shown in FIG. 14.

Referring to FIGS. 14 and 15, the memory block BLKJ may include a structure extending along first to third directions.

A substrate 6311 may be provided. For example, the substrate 6311 may include a silicon material doped by a first type impurity. For example, the substrate 6311 may include a silicon material doped by a p-type impurity or a p-type well, e.g., a pocket p-well. The substrate 6311 may further include an n-type well surrounding the p-type well. In the embodiment, it is exemplarily described that the substrate 6311 is p-type silicon. However, the substrate 6311 is not limited to being p-type silicon.

First to a fourth conductive material layers 6321 to 6324 extending along the X-direction and the Y-direction may be disposed over the substrate 6311. The first to fourth conductive material layers 6321 to 6324 may be spaced from one another in the Z-direction.

Fifth to eighth conductive material layers 6325 to 6328 extending along the X-direction and the Y-direction may be disposed over the substrate 6311. The fifth to eighth conductive material layers 6325 to 6328 may be spaced from one another in the Z-direction. The fifth to eighth conductive material layers 6325 to 6328 may be spaced from the first to fourth conductive material layers 6321 to 6324 in the Y-direction.

A plurality of lower pillars DP may be formed to penetrate the first to fourth conductive material layers 6321 to 6324. Each of the plural lower pillars DP may be extended in the Z-direction. A plurality of upper pillars UP may be formed to penetrate the fifth to eighth conductive material layers 6325 to 6328. Each of the plural upper pillars UP may be extended in the Z-direction.

Each of the lower pillars DP and the upper pillars UP may include an internal material layer 6361, an interlayer 6362 and a surface layer 6363. The interlayer 6362 may serve as a channel of the cell transistor. The surface layer 6363 may include a blocking insulating layer, a charge trap layer, and a tunnel insulating layer.

The plural lower pillars DP and the plural upper pillars UP may be coupled through a pipe gate PG. The pipe gate PG may be formed in the substrate 6311. For example, the pipe gate PG may include substantially the same material as the plural lower pillars DP and the plural upper pillars UP.

A doping material layer 6312 doped with a second type impurity may be disposed over the plural lower pillars DP. The doping material layer 6312 may extend in the X direction and the Y direction. For example, the doping material layer 6312 doped with the second type impurity may include an n-type silicon material. The doping material layer 6312 doped with the second type impurity may serve as the common source line CSL.

Drains 6340 may be formed over each of the plural upper pillars UP. For example, the drain 6340 may include an n-type silicon material. First and second upper conductive material layers 6351 and 6352 may be formed over the drains 6340. The first and second upper conductive material layers 6351 and 6352 may extend in the Y-direction.

The first and second upper conductive material layers 6351 and 6352 may be spaced apart from each other in the X-direction. For example, the first and second upper conductive material layers 6351 and 6352 may be made of metal. For example, the first and second upper conductive material layers 6351 and 6352 may be coupled to the drains 6340 through contact plugs. The first and second upper conductive material layers 6351 and 6352 may serve as first and second bit lines BL1 and BL2, respectively.

The first conductive material layer 6321 may serve as a source select line SSL, and the second conductive material layer 6322 may serve as a first dummy word line DWL1, and the third and fourth conductive material layers 6323 and 6324 may serve as first and second main word lines MWL1 and MWL2, respectively. The fifth and sixth conductive material layers 6325 and 6326 may serve respectively as third and fourth main word lines MWL3 and MWL4, and the seventh conductive material layer 6327 may serve as a second dummy word line DWL2, and the eighth conductive material layer 6328 may serve as a drain select line DSL.

Each of the plural lower pillars DP and the first to fourth conductive material layers 6321 to 6324 adjacent to the lower pillar DP may form a lower string. Each of the plural upper pillars UP and the fifth to eighth conductive material layers 6325 to 6328 adjacent to the upper pillar UP may form an upper string. The lower string and the upper string may be coupled through the pipe gate PG. One end of the lower string may be coupled to the second-type doping material layer 6312 serving as the common source line CSL. One end of the upper string may be coupled to a corresponding bit line through the drain 6340. A single lower string and a single upper string may form a single cell string coupled between the second-type doping material layer 6312 serving as the common source line CSL and a corresponding one of the upper conductive material layers 6351 and 6352 serving as the bit line BL.

That is, the lower string may include a source select transistor SST, a first dummy memory cell DMC1, and first and second main memory cells MMC1 and MMC2. The upper string may include third and fourth main memory cells MMC3 and MMC4, a second dummy memory cell DMC2 and a drain select transistor DST.

Referring to FIGS. 14 and 15, the upper string and the lower string may form the NAND string NS having a plurality of transistor structures TS. The transistor structure TS may be substantially the same as the transistors described with reference to FIG. 12.

FIG. 16 is an equivalent circuit diagram illustrating the memory block BLKj described with reference to FIGS. 14 and 15. FIG. 16 exemplarily shows first and second strings among the strings included in the memory block BLKj.

Referring to FIG. 16, the memory block BLKJ may include a plurality of cell strings, each of which comprises a single upper string and a single lower string coupled to each other through the pipe gate PG, as described with reference to FIGS. 14 and 15.

In the memory block BLKj, memory cells CG0 to CG31 stacked along a first channel layer CH1 (not shown), one or more source selection gates SSG, and one or more drain selection gates DSG may form a first string ST1. Memory cells CG0 to CG31 stacked along a second channel layer CH2 (not shown), one or more source selection gates SSG, and one or more drain selection gates DSG may form a second string ST2.

The first and second strings ST1 and ST2 may be coupled to a single drain selection line DSL and a single source selection line SSL. The first string ST1 may be coupled to a first bit line BL1, and the second string ST2 may be coupled to a second bit line BL2.

FIG. 16 shows the first and second strings ST1 and ST2 coupled to a single drain selection line DSL and a single source selection line SSL. In another embodiment, the first and second strings ST1 and ST2 may be coupled to a single source selection line SSL and a single bit line BL. In such case, the first string ST1 may be coupled to a first drain selection line DSL1, and the second string ST2 may be coupled to a second drain selection line DSL2. In another embodiment, the first and second strings ST1 and ST2 may be coupled to a single drain selection line DSL and a single bit line BL. In such case, the first string ST1 may be coupled to a first source selection line SSL1, and the second string ST2 may be coupled to a second source selection line SSL2.

Figure 17:
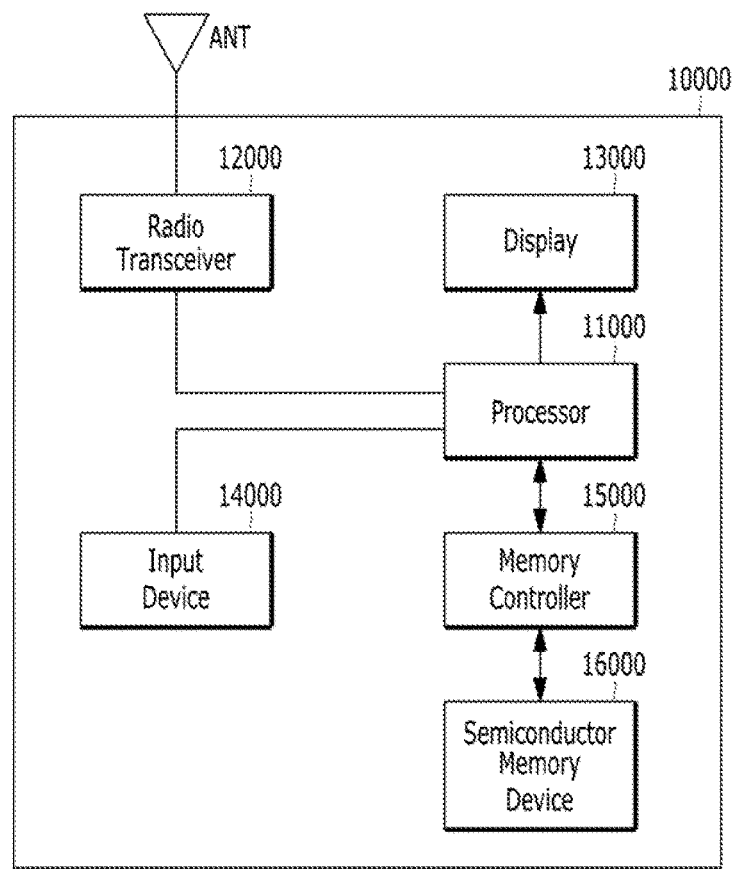
FIG. 17 is a block diagram schematically illustrating an electronic device including a semiconductor memory system in accordance with an embodiment of the present invention.

FIG. 17 is a block diagram schematically illustrating an electronic device 10000 including a memory controller 15000 and a semiconductor memory device 16000 in accordance with an embodiment of the present invention.

Referring to FIG. 17, the electronic device 10000 such as a cellular phone, a smart phone, or a tablet computer may include the semiconductor memory device 16000 implemented by a flash memory device and the memory controller 15000 to control the semiconductor memory device 16000.

The semiconductor memory device 16000 may correspond to the semiconductor memory device 200 described above with reference to FIGS. 3 to 13. The semiconductor memory device 16000 may store random data.

The memory controller 15000 may correspond to the memory controller 100 described with reference to FIGS. 3 to 13. The memory controller 15000 may be controlled by a processor 11000 which controls overall operations of the electronic device 10000.

Data stored in the semiconductor memory device 16000 may be displayed through a display 13000 under the control of the memory controller 15000. The memory controller 15000 operates under the control of the processor 11000.

A radio transceiver 12000 may receive and output a radio signal through an antenna ANT. For example, the radio transceiver 12000 may convert the radio signal received from the antenna ANT into a signal to be processed by the processor 11000. Thus, the processor 11000 may process the converted signal, and may store the processed signal at the semiconductor memory device 16000. Otherwise, the processor 11000 may display the processed signal through the display 13000.

The radio transceiver 12000 may convert a signal outputted from the processor 11000 into a radio signal, and may output the converted radio signal to an external device through the antenna ANT.

An input device 14000 may receive a control signal for controlling operations of the processor 11000 or data to be processed by the processor 11000, and may be implemented by a pointing device such as a touch pad or a computer mouse, a keypad, or a keyboard.

The processor 11000 may control the display 13000 such that the data from the semiconductor memory device 16000, the radio signal from the radio transceiver 12000 or the data from the input device 14000 is displayed through the display 13000.

Figure 18:
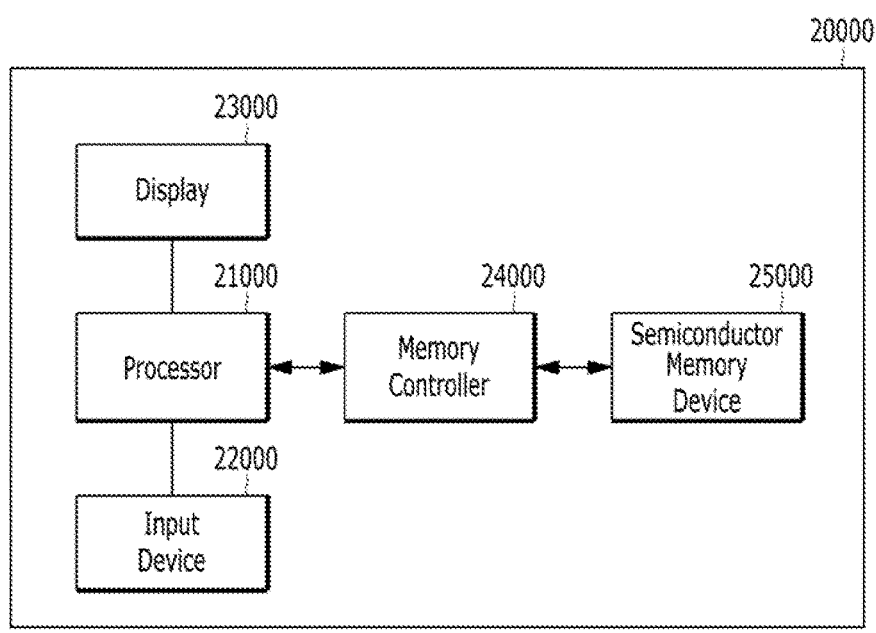
FIG. 18 is a block diagram schematically illustrating an electronic device including a semiconductor memory system in accordance with an embodiment of the present invention.

FIG. 18 is a block diagram schematically illustrating an electronic device 20000 including a memory controller 24000 and a semiconductor memory device 25000 in accordance with an embodiment of the present invention.

The memory controller 24000 and the semiconductor memory device 25000 may correspond to the memory controller 100 and the semiconductor memory device 200 described with reference to FIGS. 3 to 13, respectively.

Referring to FIG. 18, the electronic device 20000 may be implemented by a data processing device such as a personal computer (PC), a tablet computer, a netbook, an e-reader, a personal digital assistant (PDA), a portable multimedia player (PMP), an MP3 player, or an MP4 player, and it may include the semiconductor memory device 25000, e.g., the flash memory device, and the memory controller 24000 to control operations of the semiconductor memory device 25000.

The electronic device 20000 may include a processor 21000 to control overall operations of the electronic device 20000. The memory controller 24000 may be controlled by the processor 21000.

The processor 21000 may display data stored in the semiconductor memory device 25000 through a display 23000 in response to an input signal from an input device 22000. For example, the input device 22000 may be implemented by a pointing device such as a touch pad or a computer mouse, a keypad, or a keyboard.

Figure 19:
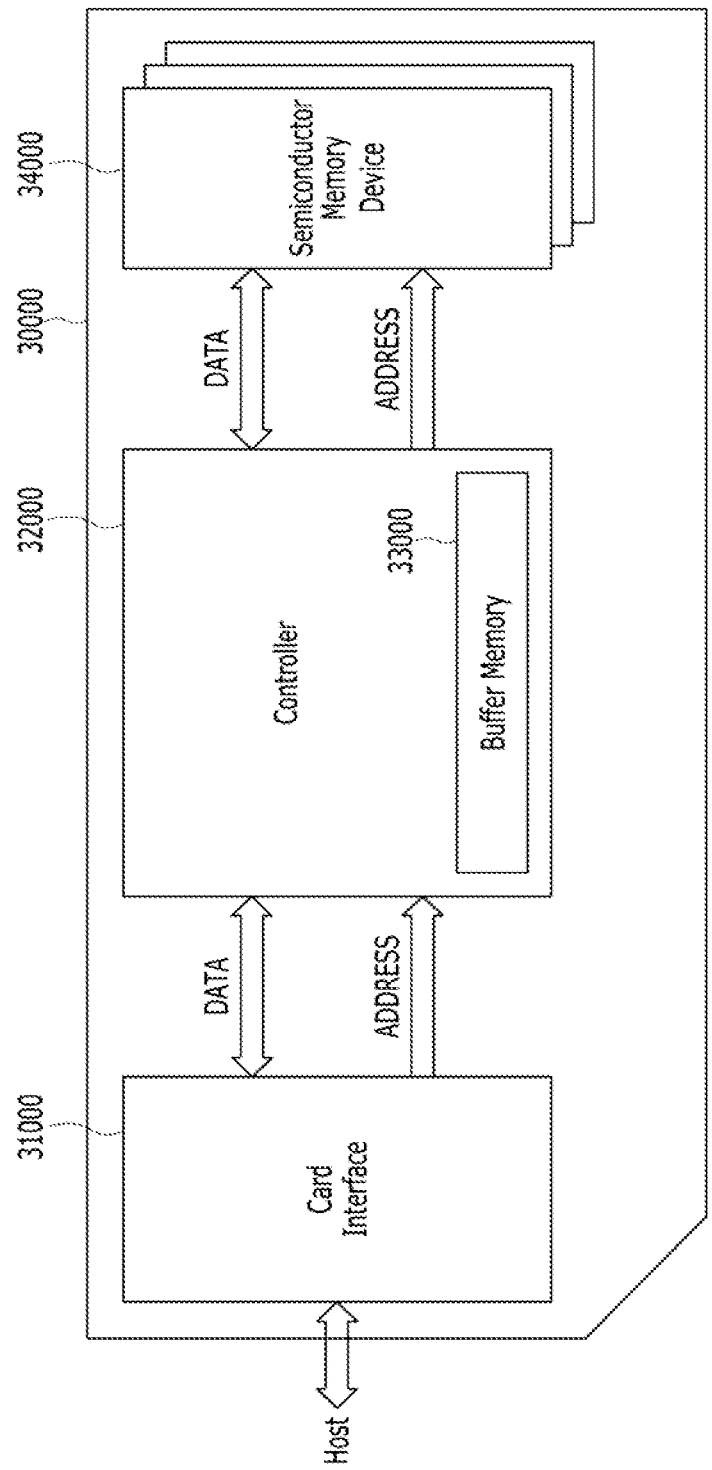
FIG. 19 is a block diagram schematically illustrating an electronic device including a semiconductor memory system in accordance with an embodiment of the present invention.

FIG. 19 is a block diagram schematically illustrating an electronic device 30000 including a controller 32000 and a semiconductor memory device 34000 in accordance with an embodiment of the present invention.

The controller 32000 and the semiconductor memory device 34000 may correspond to the memory controller 100 and the semiconductor memory device 200 described with reference to FIGS. 3 to 13, respectively.

Referring to FIG. 19, the electronic device 30000 may include a card interface 31000, the controller 32000, and the semiconductor memory device 34000, for example, a flash memory device.

The electronic device 30000 may exchange data with a host through the card interface 31000. The card interface 31000 may be a secure digital (SD) card interface or a multi-media card (MMC) interface, which does not limit the scope of the present invention. The card interface 31000 may interface the host and the controller 32000 according to a communication protocol of the host capable of communicating with the electronic device 30000.

The controller 32000 may control an overall operation of the electronic device 30000, and may control data exchange between the card interface 31000 and the semiconductor memory device 34000. A buffer memory 33000 of the controller 32000 may buffer data transferred between the card interface 31000 and the semiconductor memory device 34000.

The controller 32000 may be coupled with the card interface 31000 and the semiconductor memory device 34000 through a data bus DATA and an address bus ADDRESS. In accordance with an embodiment, the controller 32000 may receive an address of data, which is to be read or written, from the card interface 31000, through the address bus ADDRESS, and may send it to the semiconductor memory device 34000. Further, the controller 32000 may receive or transfer data to be read or written through the data bus DATA connected with the card interface 31000 or the semiconductor memory device 34000.

When the electronic device 30000 is connected with the host such as a PC, a tablet computer, a digital camera, a digital audio player, a mobile phone, console video game hardware or a digital set-top box, the host may exchange data with the semiconductor memory device 34000 through the card interface 31000 and the controller 32000.

Figure 20:
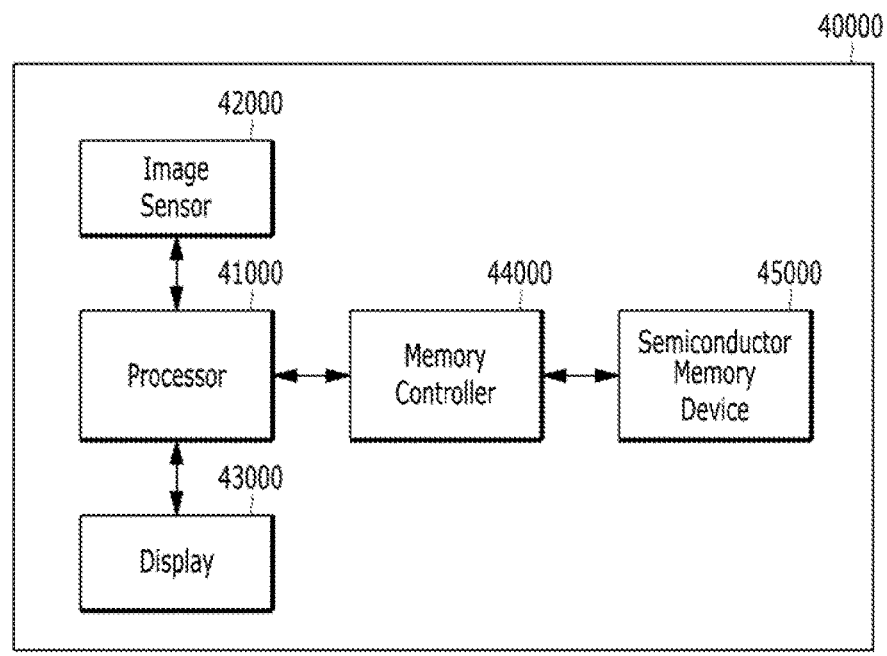
FIG. 20 is a block diagram schematically illustrating an electronic device including a semiconductor memory system in accordance with an embodiment of the present invention.

FIG. 20 is a block diagram schematically illustrating an electronic device 40000 including a memory controller 44000 and a semiconductor memory device 45000 in accordance with an embodiment of the present invention.

The memory controller 44000 and the semiconductor memory device 45000 may correspond to the memory controller 100 and the semiconductor memory device 200 described with reference to FIGS. 3 to 13, respectively.

Referring to FIG. 20, the electronic device 40000 may include the semiconductor memory device 45000, e.g., the flash memory device, the memory controller 44000 to control a data processing operation of the semiconductor memory device 45000, and a processor 41000 to control overall operations of the electronic device 40000.

Further, an image sensor 42000 of the electronic device 40000 may convert an optical signal into a digital signal, and the converted digital signal may be stored in the semiconductor memory device 45000 under the control of the processor 41000. Otherwise, the converted digital signal may be displayed through a display 43000 under the control of the processor 41000.

Figure 21:
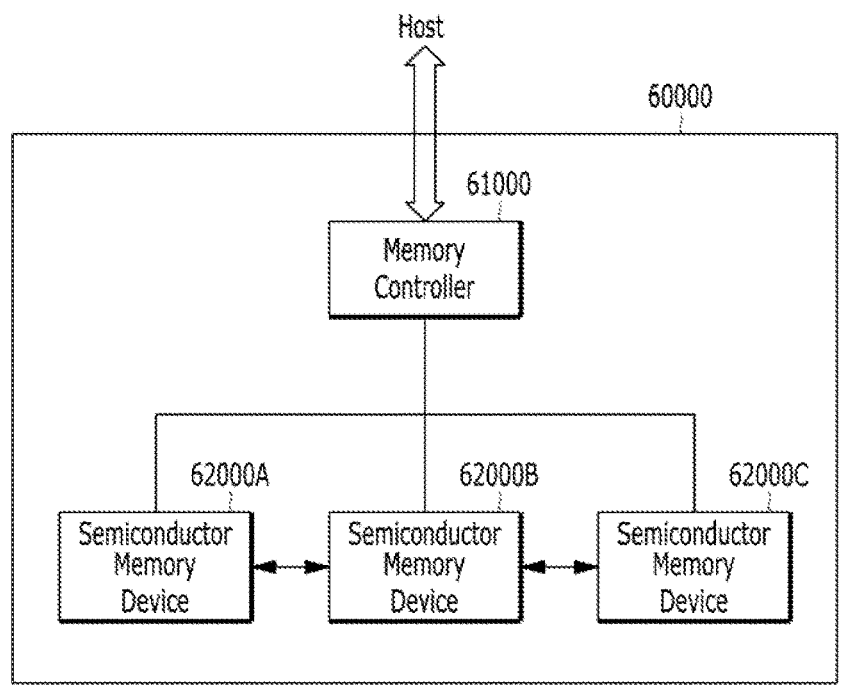
FIG. 21 is a block diagram schematically illustrating an electronic device including a semiconductor memory system in accordance with an embodiment of the present invention.

FIG. 21 is a block diagram schematically illustrating an electronic device 60000 including a memory controller 61000 and semiconductor memory devices 62000A, 62000B, and 62000C in accordance with an embodiment of the present invention.

The memory controller 61000 and each of the semiconductor memory devices 62000A, 62000B, and 62000C may correspond to the memory controller 100 and the semiconductor memory device 200 described with reference to FIGS. 3 to 13, respectively.

Referring to FIG. 21, the electronic device 60000 may be implemented by a data storage device such as a solid state drive (SSD).

The electronic device 60000 may include the plurality of semiconductor memory devices 62000A, 62000B, and 62000C and the memory controller 61000 to control a data processing operation of each of the plural semiconductor memory devices 62000A, 62000B, and 62000C.

The electronic device 60000 may be implemented by a memory system or a memory module.

For example, the memory controller 61000 may be implemented outside or inside the electronic device 60000.

Figure 22:
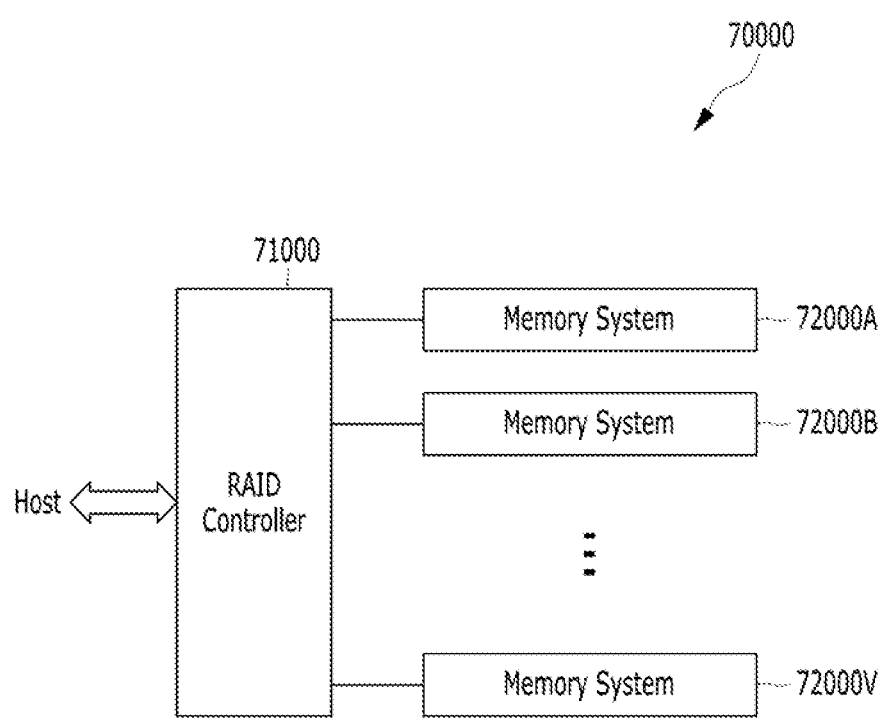
FIG. 22 is a block diagram of a data processing system including an electronic device shown in FIG. 21.

FIG. 22 is a block diagram of a data processing system including the electronic device 6000 described with reference to FIG. 21.

Referring to FIGS. 21 and 22, a data processing system 70000 may be implemented by a redundant array of independent disks (RAID) system. The data processing system 70000 may include a RAID controller 71000 and a plurality of memory systems 72000A to 72000N, where N is a natural number.

Each of the memory systems 72000A to 72000N may correspond to the electronic device 60000 described with reference to FIG. 21. The memory systems 72000A to 72000N may form a RAID array. The data processing system 70000 may be implemented by an SSD.

During a program operation, the RAID controller 71000 may output program data, which is outputted from a host, to one of the memory systems 72000A to 72000N according to one selected from a plurality of RAID levels based on RAID level information outputted from the host.

During a read operation, the RAID controller 71000 may transfer data, which is read from one of the memory systems 72000A to 72000N, to the host according to one selected from the plurality of RAID levels based on the RAID level information outputted from the host.

While the present invention has been described with respect to specific embodiments, it will be apparent to those skilled in the art that various changes and modifications may be made without departing from the spirit and scope of the invention as defined in the following claims.

What is claimed is:

1. An operating method of a memory controller, comprising:
    performing a soft read operation to read data stored in a semiconductor memory device using a soft read voltage;
    performing a soft decision ECC decoding operation to the read data based on a first log likelihood ratio (LLR) value; and
    performing the soft decision ECC decoding operation to the read data based on a second LLR value when the soft decision ECC decoding operation based on the first LLR value fails,
    wherein the first and second LLR values are selected between a default LLR value and an updated LLR value, and
    wherein the updated LLR value is generated on a basis of numbers of error bits and non-error bits of the read data, which are obtained through the soft decision ECC decoding operation to the read data.

2. The operating method of claim 1, wherein the first LLR value is the default LLR value.

3. The operating method of claim 1, wherein the first LLR value is one of the default LLR value and the updated LLR value, which is used for a successful soft decision ECC decoding operation previously performed.

4. The operating method of claim 1, wherein the default LLR value and the updated LLR value are stored in a default LLR table and an updated LLR table of the memory controller, respectively.

5. The operating method of claim 1, further comprising:
    generating or updating the updated LLR value when the soft decision ECC decoding operation based on the first or second LLR value is successful.

6. The operating method of claim 5, wherein the updated LLR value is generated or updated according to following Equation, $$\text{updated } LLR = \alpha \cdot \log \frac{\# \text{ of Error Bits}}{\# \text{ of Non-Error Bits}} \qquad \text{[Equation]}$$

$$\alpha = \begin{cases} -1 : \text{when the soft level} < \text{the Read bias} \\ 1 : \text{when the soft level} > \text{the Read bias} \end{cases},$$

wherein the "# of Error Bits" is the number of the error bits, and the "# of Non-Error Bits" is the number of the non-error bits, and the "soft level" is the soft read voltage, and the "Read bias" is a reference voltage.

7. The operating method of claim 5, wherein the generating of updating of the updated LLR value comprises:
    determining whether to generate or update the updated LLR value; and
    generating or updating the updated LLR value based on a determination result.

8. The operating method of claim 7, wherein whether to generate or update the updated LLR value is determined based on:
    a number of error-corrected bits in the read data as a success of the soft decision ECC decoding operation; and
    one or more of a first number of times the soft read operation is performed until the success of the soft decision ECC decoding operation, and a second number of iterations of the soft decision ECC decoding operation until the success of the soft decision ECC decoding operation.

9. The operating method of claim 8, wherein the updated LLR value is generated or updated when one or more of the first number of times and the second number of iterations are greater than a predetermined threshold with reference to the number of error-corrected bits.

10. The operating method of claim 1, wherein the soft decision ECC decoding operation is a low density parity check (LDPC) decoding operation.

11. A memory controller, comprising:
   a first means suitable for performing a soft read operation to read data stored in a semiconductor memory device using a soft read voltage;
   a second means suitable for performing a soft decision ECC decoding operation to the read data based on a first log likelihood ratio (LLR) value; and
   a third means suitable for performing the soft decision ECC decoding operation to the read data based on a second LLR value when the soft decision ECC decoding operation based on the first LLR value falls,
   wherein the memory controller selects the first and second LLR values between a default LLR value and an updated LLR value, and
   wherein the memory controller generates the updated LLR value on a basis of numbers of error bits and non-error bits of the read data, which are obtained through the soft decision ECC decoding operation to the read data.

12. The memory controller of claim 11, wherein the first LLR value is the default LLR value.

13. The memory controller of claim 11, wherein the first LLR value is one of the default LLR value and the updated LLR value, which is used for a successful soft decision ECC decoding operation previously performed.

14. The memory controller of claim 11, wherein the default LLR value and the updated LLR value are stored in a default LLR table and an updated LLR table, respectively.

15. The memory controller of claim 11, further comprising:
   a fourth means suitable for generating or updating the updated LLR value when the soft decision ECC decoding operation based on the first or second LLR value is successful.

16. The memory controller of claim 15, wherein the fourth means generates or updates the updated LLR value according to following Equation, $$\text{updated } LLR = \alpha \cdot \log \frac{\text{\# of Error Bits}}{\text{\# of Non-Error Bits}} \quad \text{[Equation]}$$

$$\alpha = \begin{cases} -1 : \text{when the soft level} < \text{the Read bias} \\ 1 : \text{when the soft level} > \text{the Read bias} \end{cases},$$

wherein the "# of Error Bits" is the number of the error bits, and the "# of Non-Error Bits" is the number of the non-error bits, and the "soft level" is the soft read voltage, and the "Read bias" is a reference voltage.

17. The memory controller of claim 15, wherein the fourth means comprises:
   a fifth means suitable for determining whether to generate or update the updated LLR value; and
   a sixth means suitable for generating or updating the updated LLR value according to a determination result of the fifth means.

18. The memory controller of claim 17, wherein the fifth means determines whether to generate or update the updated LLR value based on:
   a number of error-corrected bits in the read data as a success of the soft decision ECC decoding operation; and
   one or more of a first number of times the soft read operation is performed until the success of the soft decision ECC decoding operation, and a second number of iterations of the soft decision ECC decoding operation until the success of the soft decision ECC decoding operation.

19. The memory controller of claim 18, wherein the fifth means determines to generate or update the updated LLR value when one or more of the first number of times and the second number of iterations are greater than a predetermined threshold with reference to the number of error-corrected bits.

20. The memory controller of claim 11, wherein the soft decision ECC decoding operation is a low density parity check (LDPC) decoding operation.

* * * * *